United States Patent
DeHon et al.

(10) Patent No.: US 7,285,487 B2
(45) Date of Patent: Oct. 23, 2007

(54) METHOD AND APPARATUS FOR NETWORK WITH MULTILAYER METALIZATION

(75) Inventors: André DeHon, Pasadena, CA (US); Raphael Rubin, Urbana, IL (US)

(73) Assignee: California Institute of Technology, Pasadena, CA (US)

( * ) Notice: Subject to any disclaimer, the term of this patent is extended or adjusted under 35 U.S.C. 154(b) by 296 days.

(21) Appl. No.: 10/897,582

(22) Filed: Jul. 23, 2004

(65) Prior Publication Data

US 2005/0063373 A1   Mar. 24, 2005

Related U.S. Application Data

(60) Provisional application No. 60/502,539, filed on Sep. 12, 2003, provisional application No. 60/498,811, filed on Aug. 29, 2003, provisional application No. 60/490,213, filed on Jul. 24, 2003.

(51) Int. Cl.
*H01L 21/4763* (2006.01)

(52) U.S. Cl. ............... 438/618; 438/128; 370/380; 257/E21.495

(58) Field of Classification Search ............... 438/618; 370/380
See application file for complete search history.

(56) References Cited

U.S. PATENT DOCUMENTS

| | | | |
|---|---|---|---|
| 3,654,615 A | 4/1972 | Freitag | 340/172.5 |
| 5,144,563 A | 9/1992 | Date et al. | 364/491 |
| 5,200,908 A | 4/1993 | Date et al. | 716/10 |
| 5,465,218 A | 11/1995 | Handa | 716/8 |
| 5,495,419 A | 2/1996 | Rostoker et al. | 364/468 |
| 5,638,292 A | 6/1997 | Ueda | 716/8 |
| 5,744,979 A | 4/1998 | Goetting | 326/39 |
| 5,796,625 A | 8/1998 | Scepanovic et al. | 364/491 |
| 5,815,403 A | 9/1998 | Jones et al. | 719/9 |
| 5,824,570 A * | 10/1998 | Aoki et al. | 438/128 |

(Continued)

FOREIGN PATENT DOCUMENTS

WO   98/35294   8/1998

OTHER PUBLICATIONS

Alfke, P., "Efficient Shift Registers, LFSR Counters, and Long Psuedo-Random Sequence Generators," *Xilinx Application Note*, XAPP 052, INTERNET: <http://www.xilinx.com/xapp/xapp203.pdf> pp. 1-6 (Jul. 7, 1996).

(Continued)

*Primary Examiner*—Michael Lebentritt
*Assistant Examiner*—Angel Roman
(74) *Attorney, Agent, or Firm*—Ladas & Parry LLP

(57) ABSTRACT

A network for interconnecting processing element nodes which supports rich interconnection while having a number of switching elements which is linear in the number of processing elements interconnected. Processing elements connect to the lowest level of the tree and the higher levels of the tree make connections between the processing elements. The processing elements may be laid out in a two dimensional grid and one or more horizontal and vertical trees may be used to connect between the processing elements with corner switches used to connect between the horizontal and vertical trees. The levels of the tree can be accommodated in multiple layers of metalization such that the entire layout requires a two-dimensional area which is linear in the number of processing elements supported.

67 Claims, 20 Drawing Sheets

U.S. PATENT DOCUMENTS

| | | | |
|---|---|---|---|
| 5,943,486 A | 8/1999 | Fukui et al. ............... | 716/9 |
| 6,074,428 A | 6/2000 | Petler et al. ............... | 716/2 |
| 6,080,204 A | 6/2000 | Mendel ..................... | 716/7 |
| 6,150,877 A * | 11/2000 | Morikawa ................. | 327/565 |
| 6,155,725 A | 12/2000 | Scepanovic et al. ........ | 716/9 |
| 6,243,851 B1 | 6/2001 | Hwang et al. ............. | 716/10 |
| 6,292,929 B2 | 9/2001 | Scepanovic et al. ....... | 716/14 |
| 6,323,678 B1 | 11/2001 | Azegami .................. | 326/39 |
| 6,330,707 B1 | 12/2001 | Shinomiya et al. ........ | 716/14 |
| 6,405,299 B1 | 6/2002 | Vorbach et al. ........... | 712/11 |
| 6,683,872 B1* | 1/2004 | Saito et al. ............... | 370/380 |
| 6,687,893 B2 | 2/2004 | Teig et al. ................. | 716/14 |
| 6,961,782 B1* | 11/2005 | Denneau et al. ........... | 709/241 |
| 7,010,667 B2 | 3/2006 | Vorbach et al. ........... | 712/20 |
| 7,171,635 B2 | 1/2007 | Teig et al. ................. | 716/3 |
| 2003/0066043 A1 | 4/2003 | Teig et al. ................. | 716/13 |
| 2003/0174723 A1 | 9/2003 | DeHon et al. ............. | 370/404 |
| 2004/0139413 A1 | 7/2004 | DeHon et al. ............. | 716/9 |
| 2005/0035783 A1* | 2/2005 | Wang ...................... | 326/39 |
| 2006/0087342 A1* | 4/2006 | Ayodhyawasi et al. .... | 326/41 |
| 2007/0067750 A1* | 3/2007 | Amit et al. ................ | 716/13 |

OTHER PUBLICATIONS

Banerjee, P., et al., "A Parallel Simulated Annealing Algorithm for Standard Cell Placement on a Hypercube Computer," *IEEE International Conference on Computer-Aided Design*, pp. 34-37 (1986).

Banerjee, P., et al., "Parallel Simulated Annealing Algorithms for Cell Placement on Hypercube Multiprocessors," *IEEE Transactions on Parallel and Distributed Systems*, vol. 1, No. 1, pp. 91-106 (1990).

Banerjee, P., *Parallel Algorithms for VLSI Computer-Aided Design*, Chapter 3, Englewood Cliffs, New Jersey: PTR Prentice Hall, pp. 118-171 (1994).

Betz, V., et al., *Architecture and CAD for Deep-Submicron FPGAs*, Boston: Kluwer Acadmeic Publishers, pp. 50-61 (1999).

Bhatt, S.N., et al., "A Framework for Solving VLSI Graph Layout Problems," *Journal of Computer and System Sciences*, vol. 28, pp. 300-345 (1984).

Brelet, J., "An Overview of Multiple CAM Designs in Virtex Family Devices," *Xilinx Application Note*, XAPP201, INTERNET: <http://www.xilinx.com/xapp/xapp260.pdf> pp. 1-6 (Sep. 23, 1999).

Brelet, J., et al., "Designing Flexible, Fast CAMs with Virtex Family FPGAs," *Xilinx Application Note*, XAPP03, INTERNET: <http://www.xilinx.com/xapp/xapp203.pdf> pp. 1-17 (Sep. 23, 1999).

Caspi, E., et al., "Stream Computations Organized for Reconfigurable Execution (SCORE) : Introduction and Tutorial," presented at the Tenth International Conference on Field Programmable Logic and Applications, Villach, Austria, INTERNET:<http://www.cs.berkeley.edu/projects/brass/documents/score_tutorial.html> 31 pages total (Aug. 25, 2000).

Chan, P.K., et al., "Acceleration of an FPGA Router," *Proceedings of the IEEE Symposium on FPGAs for Custom Computing Machines, IEEE*, pp. 175-181 (Apr. 1997).

Chan, P.K., et al., "New Parallelization and Convergence Results for NC: A Negotiation-Based FPGA Router," *Proceedings of the 2000 International Symposium on Field-Programmable Gate Arrays (FPGA '00), ACM/SIGDA*, pp. 165-174 (Feb. 2000).

Chan, Pak K., et al., "Parallel Placement for Field-Programmable Gate Arrays," presented at the Eleventh ACM International Symposium on Field-Programmable Gate Arrays, Monterey, California, INTERNET: <http://www.doi.acm.org/10.1145/103724.103725> pp. 43-50 (2003).

Chong, F., et al., "METRO: A Router Architecture for High-Performance, Short-Haul Routing Networks," *Proceedings of the Annual International Symposium on Computer Architecture*, Chicago, IEEE, Vol. SYMP, 21, pp. 266-277 (Apr. 18-21, 1994).

Chyan, Dah-Jun, et al., "A Placement Algorithm for Array Processors," presented at the *ACM/IEEE Design Automation Conference*, Miami Beach, Florida, INTERNET: <http://portal.acm.org/citation.cfm?id=800661> pp. 182-188 (1983).

Compton, K., et al., "Reconfigurable Computing: A Survey of Systems and Software," *ACM Computing Surveys (CSUR)*, vol. 34, No. 2, INTERNET:<http://doi.acm.org/10.1145/508352.50353> pp. 171-210 (Jun. 2002).

Dally, W.J., "Express Cubes: Improving the Performance of $k$-ary $n$-cube Interconnection Networks," *IEEE Transactions on Computers*, vol. 40, No. 9, pp. 1016-1023 (Sep. 1991).

DeHon A., "Balancing Interconnect and Computation in a Reconfigurable Computing Array (or why you don't really want 100% LUT utilization)," *Proceedings of the 1999 ACM/SGDA Seventh International Symposium on Field Programmable Gate Arrays*, p. 1-10 (Feb. 21-23, 1999).

DeHon, A., "Entropy, Counting and Programmable Interconnect," *FPGA '96, ACM-SIGDA Fourth International Symposium on FPGAs*, Monterrey CA, Fig. 2, (Feb. 11-13, 1996).

DeHon, A., "Compact, Multilayer Layout for Butterfly Fat-Tree," *Proceedings of the Twelfth ACM Symposium on Parallel Algorithms and Architectures*, 10 pages total (Jul. 2000).

DeHon, A., et al., "Hardware-Assisted Fast Routing," *IEEE Symposium on Field-Programmable Custom Computing Machines*, Napa Valley, California, INTERNET: <http:www.cs.caltech.edu/research/ic/abstracts/fastroute_feem2002.html> pp. 1-11 (Apr. 22-24, 2002).

DeHon, A., "Rent's Rule Based Switching Requirements System Level Interconnect Prediction," *SLIP 2001*, pp. 197-204 (Mar. 31-Apr. 1, 2001).

Erényi, I., et al., "FPGA-based Fine Grain Processor Array Design Considerations," *Proceedings of the Third IEEE International Conference*, pp. 659-662 (1996).

Fiduccia, C.M., et al., "A Linear-Time Heuristic for Improving Network Partitions," *19th Design Automation Conference*, Paper 13.1, pp. 175-181 (1982).

Greenberg, R.I., et al., "A Compact Layout for the Three-Dimensional Tree of Meshes," Appl. Math. Lett., vol. 1, No. 2, pp. 171-176 (1988).

Greenberg, R.I., et al., "Randomized Routing on Fat-Trees," *Laboratory for Computer Science, Massachusetts Institute of Technology*, Cambridge, Massachusetts, pp. 1-23 (Jun. 13, 1996).

Goto, S., "An Efficient Algorithm for the Two-Dimensional Placement Problem in Electrical Circuit Design, " *IEEE Transactions on Circuits and Systems*, vol. CAS-28, No. 1, pp. 12-18 (Jan. 1981).

Haldar, M., et al., "Parallel Algorithms for FPGA Placement," *Proceedings of the Tenth Great Lakes Symposium on VLSI*, INTERNET: <http://doi.acm.org/10.1145/330855.330988> pp. 86-94 (2000).

Henry, D.S., et al., "Cyclic Segmented Parallel Prefix," *Ultrascalar Memo 1*, Yale (Nov. 1998).

Horvath, E.I, "A Parallel Force Direct Based VLSI Standard Cell Placement Algorithm," *Proceedings of the International Symposium on Circuits and Systems*, vol. 2, pp. 2071-2074 (1993).

Huang, R., et al., "Stochastic, Spatial Routing for Hypergraphs, Trees, and Meshes," *Eleventh ACM International Symposium on Field-Programmable Gate Arrays*, INTERNET:<http://www.cs.caltech.edu/research/ic/abstracts/fastroute_fpga2003.html> 12 pages total (Feb. 23-25, 2003).

Iosupovici, A., "A Class of Array Architectures for Hardware Grid Routers," *IEEE Transactions on Computer-Aided Design of Integrated Circuits and Systems*, vol. CAD-5, No. 2, pp. 245-255 (Apr. 1986).

Kernighan, B.W., et al., "An Efficient Heuristic Procedure for Partitioning Graphs," *Bell Syst. Tech. J.*, vol. 49, No. 2, pp. 76-80 (Feb. 1970).

Kirkpatrick, S., et al., "Optimization by Stimulated Annealing," *Science*, vol. 220, No. 4598, pp. 671-680 (May 13, 1983).

Kravitz, S.A, et al., "Multiprocessor-Based Placement by Stimulated Annealing," presented at the *Twenty-Third IEEE Design Automation Conference*, Las Vegas, Nevada INTERNET: <http://doi.acm.org/10.1145/318013.318104> pp. 567-573 (1986).

Landman, B.S., et al., "On Pin Versus Block Relationship for Partitions of Logic Graphs," *IEEE Transactions on Computers*, vol. C-20, No. 12, pp. 1469-1479 (1971).

Leiserson, C.E., "Fat Trees: Universal Networks for Hardware-Efficient Supercomputing," *IEEE Transactions on Computers*, vol. C-34, No. 10, pp. 892-901 (Oct. 1985).

McMurchie, L., et al., "PathFinder: A Negotiation-Based Performance-Driven Router for FPGAs," *Proceedings of the ACM/SIGDA International Symposium on Field-Programmable Gate Arrays, ACM*, pp. 111-117 (Feb. 1995).

"METIS: Family of Multilevel Partitioning Algorithms," INTERNET: <http://www-users.cs.umn.edu/~karypis/metis/index.html> 1 page total (Retrieved on Feb. 4, 2005).

Mulpuri, C., et al., "Runtime and Quality Tradeoffs in FPGA Placement and Routing," *Proceedings of the Ninth International Symposium on Field-Programmable Gate Arrays*, INTERNET:<http://www.ee.washington.edu/faculty/hauck/publications/RuntimeTradeoffs.pdf> pp. 29-36 (Feb. 11-13, 2001).

Ryan, T., et al., "An ISMA Lee Router Accelerator," *IEEE Design and Test of Computers*, pp. 38-45 (Oct. 1987).

Sai-Halasz, G.A., "Performance Trends in High-End Processors," Proceedings of the IEEE, vol. 83, No. 1, pp. 20-36 (Jan. 1995).

Sankar, Y., et al., "Trading Quality for Compile Time: Ultra-Fast Placement for FPGAs," *Proceedings of the 1999 ACM/SIGDA Seventh International Symposium on Field Programmable Gate Arrays*, INTERNET:<http://www.eecg.toronto.edu/~jayar/pubs/sankar/fpga99sankar.pdf> pp. 157-166 (1999).

Schnorr, C.P., et al., "An Optimal Sorting Algorithm For Mesh Connected Computers," *presented at the Eighteenth Annual ACM Symposium on Theory of Computing*, Berkeley, CA, INTERNET: <http://doi.acm.org/10.1145/359461.359481> pp. 255-270 (1986).

Shahookar, K., et al., "VSLI Cell Placement Techniques," *ACM Computing Surveys (CSUR)*, vol. 23, No. 2, pp. 143-220 (Jun. 1991).

Spira, P., et al., "Hardware Acceleration of Gate Array Layout," *presented at the 22nd ACM/IEEE Design Automation Conference*, Las Vegas, Nevada, INTERNET: <http://doi.acm.org/10.1145/317825.317913> pp. 359-366 (1985).

"SS7 Tutorial," *Performance Technologies*, INTERNET: <http://www.pt.com/tutorials/ss7> pp. 1-23 (Aug. 22, 2001).

Swartz, J.S., et al., "A Fast Routability-Driven Router for FPGAs," *Proceedings of the 1998 International Symposium on Field-Programmable Gate Arrays (FPGA '98)*, pp. 140-149 (Feb. 1998).

Tessier, R., "Fast Placement Approaches for FPGAs," *ACM Transactions on Design Automation of Electronic Systems (TODAES)*, vol. 7, No. 2, pp. 284-305, (Apr. 2002).

Tessier, R., "Negotiated A* Routing for FPGAs," *Proceedings of the 5th Canadian Workshop on Field Programmable Devices*, 6 pages total (Jun. 1998).

Thomson, C.D., "Area-Time Complexity for VLSI," *Eleventh Annual ACM Symposium on Theory of Computing*, pp. 81-88 (May 1979).

Thompson, C.D., et al., "Sorting on a Mesh-Connected Parallel Computer," *Communications of the ACM*, vol. 20, No. 4, pp. 263-271 (Apr. 1977).

Togawa, N., et al., "Maple: A Simultaneous Technology Mapping, Placement, and Global Routing Algorithm for Field-Programmable Gate Arrays," *IEEE/ACM International Conference on Computer-Aided Design*, pp. 156-163 (1994).

Togawa, N., et al., "An Incremental Placement and Global Routing Algorithm for Field-Programmable Gate Arrays," *Design Automation Conference*, pp. 519-526 (1998).

Tsu, W., et al., "HSRA: High-Speed, Hierarchical Synchronous Reconfigurable Array," *Proceedings of the International Symposium on Field Programmable Gate Arrays*, pp. 1-10 (Feb. 1999).

Wu, Yu-Liang, et al., "Graph-Based Analysis of 2-D FPGA Routing," *IEEE Transactions on Computer-Aided Design of Integrated Circuits and Systems*, vol. 15, No. 1, pp. 33-44 (Jan. 1996).

* cited by examiner

No Flattening (f = 1)

Flattening (f = 2)

Flattening (f = 4)

No Staggering

Staggered

MoT overlap for all mesh corner turns

Mesh ($L_{seg} = 2,4$)

Standard MoT with shortcut and corner turns

METHOD AND APPARATUS FOR NETWORK WITH MULTILAYER METALIZATION

CROSS REFERENCE TO RELATED APPLICATIONS

This application claims benefit of the following applications: U.S. Provisional Application No. 60/490,213, filed on Jul. 24, 2003; U.S. Provisional Application No. 60/498,811, filed on Aug. 29, 2003; and U.S. Provisional Application No. 60/502,539, filed on Sep. 12, 2003, all of which are incorporated herein by reference in their entirety.

STATEMENT REGARDING FEDERALLY SPONSORED RESEARCH OR DEVELOPMENT

The present invention was made with support from the United States Government under Grant No. N00014-01-0651 awarded by the Office of Navel Research of the Department of the Navy. The United States Government has certain rights in the invention.

BACKGROUND

1. Field

The present disclosure describes methods and techniques for interconnecting a collection of processing elements in which multiple metallization layers may be used. For example, the present disclosure describes a method and apparatus for interconnecting compute, memory and/or logic blocks in a Field Programmable Gate Array (FPGA), System-on-a-Chip (SoC), Programmable System-on-a-Chip (PSOC), multi-processor chip, structured Application Specific Integrated Circuits (ASIC), or heterogeneous combinations of such elements.

2. Description of Related Art

VLSI technology has advanced considerably since the first gate arrays and FPGAs. Feature sizes have shrunk, die sizes and raw capacities have grown, and the number of metal layers available for interconnect has grown. The most advanced VLSI processes now sport 7-9 metal layers, and metal layers have grown roughly logarithmically in device capacity. Multi-level metalization, and particularly the current rate of scaling, may provide additional capability for interconnect requirements for typical designs which grow faster than linearly with gate count. The accommodation of the growing wire requirements by using multiple wire layers in the third dimension, may allow the maintenance of constant density for arrays of processing elements such as FPGAs, processor arrays, gate arrays, and similar devices.

Interconnection networks typically referred to as meshes, Tree of Meshes, and Mesh of Trees are known in the art. Such networks are instances of limited-bisection networks. That is, rather than supporting any graph connectivity, like a crossbar or Benes network, these networks are designed to exploit the fact that a typical N-node circuit or computing graph can be bisected (cut in half) by cutting less than O(N) hyperedges. This is significant as the bisection width of a network, BW, directly places a lower bound on the size of the network when implemented in very large scale integration (VLSI). See, for example, C. Thompson, "Area-time complexity for VLSI," *Proceedings of the Eleventh Annual ACM Symposium on Theory of Computing*, May 1979, pp. 81-88. With a crossbar or Benes network, the bisection width is O(N), as is the subsequent bisection of each half of the network. This means the horizontal and vertical width of the design, when implemented in a constant number of metal layers, must be O(N) which implies $O(N^2)$ VLSI layout area. In contrast, a network which only has BW<O(N) bisection width may be implemented in less area as described below.

A common way of summarizing the wiring requirements for circuits is Rent's Rule, as described by B. S. Landman and R. L. Russo, "On pin versus block relationship for partitions of logic circuits," *IEEE Transactions on Computers*, vol. 20, pp. 1469-1479, 1971. Landman and Russo articulate this model for relating the number of gates N and the total number of input and outputs signals, IO, where $IO=cN^p$. This relationship assumes that maximization of locality is desired, i.e., the groups of N gates are selected so as to minimize the number of signals which connect gates in a group to gates in other groups. In Rent's Rule, c and p are parameters that can be tuned to fit the IO versus N connectivity relationship for a design; c is a constant factor offset which roughly corresponds to the IO size of the leaf cells in a design, and p defines the growth rate. Hence, p can be viewed as a measure of locality. With p=1, the design has O(N) bisection bandwidth and hence has little locality. As p decreases, the design has more locality and admits to smaller implementations. Landman and Russo, and a large body of subsequent work, observe that typical designs have $0.5 \leq p \leq 0.75$.

Returning to the bisection based area lower bound, assuming a fixed number of wiring layers, the bisection width is as follows:

$$BW(\text{chip half}) = IO(\text{chip half}) = IO\left(\frac{N}{2}\right)$$

which can be used to determine the wiring requirements:

$$A_{wire} > BW\left(\frac{N}{2}\right) \times BW\left(\frac{N}{2}\right)$$

$$> c\left(\frac{N}{2}\right)^p \times c\left(\frac{N}{4}\right)^p = \left(\frac{c^2}{8^p}\right) N^{2p}$$

Rent's Rule provides a way of succinctly characterizing the wiring requirements for typical, limited-bisection designs. The equation above shows a lower bound on the wiring requirements for any layout of a graph with Rent characteristics (c,p). That is, any physical network which supports such a graph must have at least this much wiring.

The Tree-of-Meshes (ToM) network is described in F. T. Leighton, "New lower bound techniques for VLSI," in *Twenty-Second Annual Symposium on the Foundations of Computer Science*. IEEE, 1981. FIG. 1 illustrates the ToM topology with multiple compute blocks 101 connected to other compute blocks 101 by interconnects 103, where c=3 and p=0.5. The ToM network is further described in S. Bhatt and F. T. Leighton, "A framework for solving VLSI graph layout problems," *Journal of Computer System Sciences*, vol. 28, pp. 300-343, 1984, as a stylized, limited-bisection network which could be used as a template for the layout of any limited bisection design and could be the basis of a configurable routing network. Bhatt and Leighton use (α, F) as their parameterization rather than Rent's Rule's (c,p), but they define an equivalent space ($F=cN_{max}^p$, $\alpha=2^p$). By tuning the child to parent channel width growth of each of the tree stages, the ToM network can be parameterized to support the (c, p) wiring requirements for any circuit.

Significantly, if a design is recursively partitioned and its IO versus partition size relationship does not exceed the (c,p) of a ToM network, a (4c,p) ToM network will always be able to route it. Using asymptotically the same number of switches, but organizing them differently, the factor of four can be reduced. Using a crossbar type interpretation of the ToM, $$a\left(\frac{3c}{2}, p\right)$$

network supports the (c, p) design. See, for example, A. DeHon, "Rent's Rule Based Switching Requirements," *Proceedings of the System-Level Interconnect Prediction Workshop SLIP '2001*), ACM, March 2001, pp. 197-204.

C. E. Leiserson, "Fat-trees: Universal networks for hardware efficient supercomputing," *IEEE Transactions on Computers*, vol. C-34, no. 10, pp. 892-901, October 1985, describes adapting the ToM network into a Fat Tree. Leiserson further defines a linear switch population version called the Butterfly Fat Tree (BFT) in R. J. Greenberg and C. E. Leiserson, *Randomness in Computation*, ser. Advances in Computing Research, JAI Press, 1988, vol. 5, ch. Randomized Routing on Fat-Trees, earlier version MIT/LCS/TM-307. FIG. 2 shows a BFT network having c=1, p=0.5 and an arity of 4.

The Hierarchical Synchronous Reconfigurable Array (HSRA), described in W. Tsu, K. Macy, A. Joshi, R. Huang, N. Walker, T. Tung, O. Rowhani, V. George, J. Wawrzynek, and A. DeHon, "HSRA: High-Speed, Hierarchical Synchronous Reconfigurable Array," *Proceedings of the International Symposium on Field Programmable Gate Arrays*, February 1999, pp. 125-134, is logically equivalent to a BFT. FIG. 3 shows a HSRA with c=3, p=0.5 and an arity of 2. Both the BFT and HSRA are "linearly populated" in that they have only a linear number of switches (linear in the number of child input channels) in each hierarchical switch box rather than the quadratic number required by a full ToM network. One consequence of linear population is that the BFT or HSRA requires a total number of switches that is linear in the number of endpoints supported for any p<1.

As briefly discussed above, another network known in the art is the Manhattan interconnect scheme, also known as Symmetric or Island-style interconnection. In the Manhattan interconnect, a routing channel containing W wires track between every row and column of processing elements. FIG. 4 shows the standard model of a Manhattan interconnect scheme. Each compute block 101 (look-up table (LUT) or island of LUTs) is connected to adjacent channels by a connect box (C-box) 102. At each channel intersection is switch box (S-box) 104, which allows wires to be linked into longer signal runs or make Manhattan turns. In the C-box 102, each compute block 101 input/output pin is connected to a fraction of the wires in a channel. At the S-box 104, each channel on each of the 4 sides of the S-box connects to one or more channels on the other sides of the S-box 103.

The Manhattan interconnect scheme may be analyzed on the basis of the number of sides of the compute block 101 on which each input or output of a gate appeared (7), the fraction of wires in each channel each of these signals connected to ($F_c$), and the number of switches connected to each wire entering an S-box 104 ($F_s$). Regardless of the detail choices for these numbers, they have generally been considered constants, and the asymptotic characteristics are independent of the particular constants chosen.

For example, assume each side of the compute block has I inputs or outputs to the channel. If the compute block comprises a single-output k-LUT, then $$I = \frac{T \times (k+1)}{4}.$$

The number of switches $C_{sw}$ in a C-box 102 is $C_{sw}=2 \cdot F_c \cdot I \cdot W$, where W is the width of the channel. Each S-box requires the following number of switches $$S_{sw} = \left(\frac{4}{2}\right) \cdot F_s \cdot W = 2 \cdot F_s \cdot W.$$

As shown in FIG. 4, a compute segment 100 typically comprises a compute block 101, two C-boxes 102 and one S-box 104. Therefore, the total number of switches per compute segment 100 is: $B_{sw}=2 \cdot C_{sw}+S_{sw}=2W(2 \cdot F_c \cdot I+F_s)$. As indicated above $F_s$ are generally considered constants, so it can be seen that the number of switches required per compute segment 100, i.e., per compute block 101, is $B_{sw}=O(W)$. That is, the number of switches is linear in W, the channel width.

A loose bound on the channel width may be found by looking at the bisection width of a design. A Manhattan mesh arranged in $\sqrt{N} \times \sqrt{N}$ processing elements has $\sqrt{N}+1$ horizontal and vertical elements. The total bisection width of the mesh in the horizontal or vertical direction is then: $BW_{mesh}=(\sqrt{N}+1)W$. That is, the design requires at least $BW_{mesh}$ bandwidth across the $\sqrt{N}$ row (or column) channels which cross the middle of the chip containing the design. To support a design characterized by Rent Parameters (c,p), the Manhattan mesh will need:

$$BW_{mesh} \geq c\left(\frac{N}{2}\right)^p$$

$$(\sqrt{N}+1)W \geq c\left(\frac{N}{2}\right)^p.$$

The plus one can be dropped without affecting the asymptotic implications, providing:

$$(\sqrt{N}+1)W \geq c\left(\frac{N}{2}\right)^p$$

$$W \geq \left(\frac{c}{2^p}\right)N^{(p-0.5)} = O(N^{(p-0.5)}),$$

which gives a lower bound on channel width which a Manhattan mesh will need to support a Rent characterized (c,p) design. However, the mesh will generally require more wire channels than this because: 1) the calculation is based only on bisection wires, but the channels may need to be wider to hold wires in some of the recursive cuts; and 2) the calculation assumes optimal wire spreading, but it may not be possible to spread wires evenly across all channels without increasing channel widths in the orthogonal channels.

From the equations above, the total number of switches per compute block can be defined by:

$$B_{sw}=O(W(N))=O(N^{(p-0.5)})$$

Therefore, as larger designs are implemented, if the interconnect richness is greater than p=0.5, the switch requirements per compute block grow for systems using the Manhattan interconnect scheme. That is, the aggregate switching requirements grow superlinearly with the number of compute blocks supported.

Many designs use segments that span more than one S-box. See, for example, FIG. 5, which shows segments that span two switchboxes. Designs having length 4-8 buffered segments may require less area than designs that do not use such segments. The segment length may be represented by $L_{seg}$ and in FIG. 5, $L_{seg}=2$. However, such fixed segmentation schemes usually only change the constants related to the number of switches require and generally do not change the asymptotic growth factor in the required number of switches, described above. For example, using a single segmentation scheme of length $L_{seg}$ will change the switch requirements for an S-box to $$S_{sw} = \left(\frac{1}{L_{seg}}\right)(2)F_s \cdot W = \left(\frac{2}{L_{seg}}\right)F_s \cdot W.$$

Generally, the W will be different between the segmented and non-segmented cases, where the segmented cases will require larger W's. However, the asymptotic lower bound relationship as described above will still apply. Similarly, a mixed segmentation scheme will also change the constants, but not the asymptotic requirements. Therefore, the Manhattan interconnect scheme, whether segmented or not, still generally results in a superlinear growth in the switching requirements with an increase in the number of compute blocks.

A hierarchical segmentation scheme may allow for the reduction of switchbox switches. For example, a hierarchical scheme may have a base number of wire channels $W_b$ and the channels may be populated with $W_b$ single length segments, $W_b$ length 2 segments, $W_b$ length 4 segments, and so forth. Using the equation presented above for calculating the number of switchbox switches in a single segmentation scheme with $W_b$ substituted for W and summing across the geometric wire lengths, the total number of switches per switchbox is:

$$S_{sw} = \left(\sum_{L_{seg}=1}^{N_{level}} \left(\frac{1}{L_{seg}}\right)\right)(2)F_s \cdot W_b = \left(\frac{1}{1} + \frac{1}{2} + \frac{1}{4} + \ldots\right) \leq 4 \cdot F_s \cdot W_b$$

In such a hierarchical segmentation scheme, the total wire width of a channel is:

$$W = N_{level} \cdot W_b$$

For sufficiently large $N_{level}$, W can be raised to the required bisection width. Since $S_{sw}$ in this hierarchical case does not asymptotically depend on $N_{level}$, the number of switches per switchbox converge to a constant.

However, such a hierarchical scheme does not eliminate the asymptotic switch requirements. As described above, the switch requirements depend on both the C-box switches and the S-box switches. As long as the C-box switches continue to connect to a constant fraction of W and not $W_b$, the C-box contribution to the total number of switches per compute block continues to make the total number of switches linear in W and hence growing with N. This indicates that the flat connection of blocks IOs to the channel impedes scalability.

Conventional experience implementing the Manhattan interconnect scheme has led to the observation that switch requirements tend to be limiting rather than wire requirements. For example, an N-node FPGA will need:

$$N_{switch}(N) = B_{sw} \cdot N = O(N^{(p+0.5)})$$

With BW wires in the bisection, the wire requirements will be:

$$A_{wire}(N) \geq \left(\frac{BW}{L/2}\right)^2 = O\left(\frac{N^{2p}}{L^2}\right)$$

For a fixed number of wire layers (L), the wiring requirements will grow slightly faster than switches (i.e., when p>0.5, 2p>p+0.5). Asymptotically, this suggests that if the number of layers, L, grows as fast as $$O(N^{(2p-1/4)}),$$

then the design will remain switch dominated. Since switches have a much larger constant contribution than wires, it is not surprising that designs require a large N for these asymptotic effects to become apparent.

Therefore, there is a need in the art for an apparatus and method that provides for interconnections in a device such as an FPGA that allows for the use of fewer switches than a Manhattan mesh as the device is scaled up.

While these networks have been described in terms of FPGAs, it should be clear that interconnection networks of this kind are relevant to all scenarios where programmable interconnect nodes are used and these nodes can be gates, LUTs, PLAs, ALUs, processors, memories, arrays of LUTs, or custom functional units. This need is similar whether the network is configured (as typical for FPGAs), time switched, circuit switched, or packet switched. Further, these networks can be configured at the time of fabrication, such as in gate-arrays and structured ASICs.

Leighton also introduced the Mesh of Trees ("New Lower Bound Techniques for VLSI," *Twenty-second Annual Symposium on the Foundations of Computer Science*, IEEE, 1981 and *Introduction to Parallel Algorithms and Architectures: Arrays, Trees, Hypercubes*. Morgan Kaufman Publishers, Inc. 1992) as shown in FIG. 6. The Mesh of Trees (MoT) can be seen as a hybrid between a Tree-of-Meshes and a Manhattan array. It uses hierarchical interconnect like the Tree-of-Meshes, but builds the trees in rows and columns similar to the Manhattan interconnect. Leighton's Mesh of Trees was explicitly a p=0.5 structure.

FIG. 6 shows a MoT arrangement comprising a binary tree built along each row and column of a grid of compute blocks 101 with switching between compute blocks 101 provided by switch assemblies 110. The compute blocks 101 connect only to the lowest level of the tree. Connection can then climb the tree in order to get to longer segments. Each compute block 101 is simply connected to the leaves of the set of horizontal and vertical trees which land at its site.

Dally introduced the Express Cube ("Express Cubes: Improving the performance of k-ary n-cube interconnection networks" in IEEE Transactions on Computers v40n9p1016-1023) to exploit multiple levels of printed-circuit board wiring and to reduce signal delays. He did not teach how to parameterize the express cube network or how to lay one out efficiently.

G. A. Sai-Halasz in "Performance Trends in High-End Processors," *Proceedings of the IEEE*, 83(1):20-36, January 1995 indicate that wiring on an upper layer metal plane will occupy 10-15% of all the layers below it. Integrating this result across wire planes, he argues that there is a useful limit of 6-7 wiring levels.

DeHon ("Compact, Multilayer Layout for Butterfly Fat-Tree" in *Proceedings of the Twelfth ACM Symposium on Parallel Algorithms and Architectures*, July 2000) showed that the p=0.5 BFT and HSRA could be laid out in constant area per endpoint node (processing element) using a logarithmic number of metal layers.

Therefore, there is a need in the art for a set of techniques that allow one to interconnect processing elements using a limited-bisection network which can be efficiently (with O(N) 2D area) realized using multiple metal layers. Further, there is a need for general techniques to layout graphs efficiently (O(N) 2D area) exploiting multiple metal layers.

SUMMARY

Embodiments of the present invention make use of a tree topology to provide connections between processing, such as those used in FPGAs. Embodiments of the present invention may have multiple horizontal and vertical trees in which compute blocks are connected to the leaves of the trees which land at its site. Corner switches may be used to connect between the horizontal and vertical trees at selected levels within the trees. A Mesh of Trees topology is preferred, since it may be used for a wide variety of applications.

Some embodiments according to the present invention support mapping a BFT/HSRA topology to a MoT topology, which allows for an improved BFT/HSRA layout. Further, using this mapping and the layout according to embodiments of the present invention, a BFT/HSRA topology can be used to layout any graph.

Some embodiments according to the present invention comprise one or more trees where wiring for the higher levels in the trees are assigned to equal or higher metal layers in a multiple metal layer structure. If the processing elements are laid out in a two-dimension grid, trees in a first dimension may be considered trees for horizontal channels and trees in a second dimension may be considered trees for vertical channels. However, embodiments of the present invention are not limited to two dimensional grids, nor are the embodiments limited only to horizontal and vertical trees.

As described in additional detail below, switches providing inter-tree-level routing in the horizontal (and vertical) trees are each associated with a processing element located at an endpoint of the tree. This association guarantees that the switches can be placed within the wire span of the child and parent. The association also further guarantees that each endpoint has the same number of inter-tree-level switches associated with it. This number asymptotically converges to a constant that is independent of the size of the tree that is built.

When the trees are disposed in a multiple metal layer structure, a via row may be used to bring the signals from the upper metal layers, where parent and child levels are being switched together, to the designated substrate level (or a programmable via level). Since there are a constant number of switches at each processing element, there will be only a constant number of such via. Hence, there should be no saturation of the via connectivity for the intervening levels.

Some embodiments according to the present invention may provide better scalability than the flat, Manhattan interconnect topology described above. Assuming the number of base channels, C, remains constant for increasing design size, the total number of switches per LUT in embodiments according to the present invention generally converges to a constant [O(1)] independent of design size. As discussed above, the flat, Manhattan interconnect generally requires $O(N^{p-0.5})$ switches per LUT. Given sufficient wiring layers, embodiments of the present invention can maintain a constant area per logic block as the design scales up. Asymptotically, the number of switches in any path in embodiments of the present invention needs to only grow as $O(\log(N))$. Analysis of designs using embodiments according to the present invention shows small C values that do not grow with design size, and total switch requirements that are 26% smaller than those achieved using the flat, Manhattan interconnect topology.

According to embodiments of the present invention, any circuit can be laid out in a linear two-dimensional area. This may be done by a) recursively partitioning the circuit using efficient bi-partitioners/separators; b) assigning nodes to a HSRA or MoT topology with homogeneous, upper-level corner turns; c) routing wires along network paths in a MoT topology; and d) using the MoT layout according to embodiments of the present invention to determine the routing of each wire.

Other embodiments according to the present invention provide a method for fast, guaranteed routing. Such embodiments generally comprise recursively bisecting a network, mapping the bisected network to a BFT topology, and then populating the mapped network using the efficient layout disclosed herein and randomly adding shortcuts, corner turns, and additional uplinks. The network parameters can be selected such that no back tracking is needed in the mapping and the placement and routing will be successful.

BRIEF DESCRIPTION OF THE DRAWINGS

The present disclosure will be understood and appreciated more fully from the following detailed description in conjunction with the following drawings.

DETAILED DESCRIPTION

Figure 1:
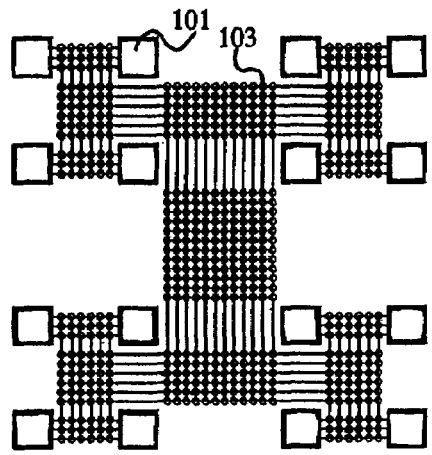
FIG. 1 (prior art) illustrates the Tree of Meshes topology.

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of layers and other elements shown in the accompanying drawings may be exaggerated to more clearly show details. The present invention should not be construed as being limited to the dimensional relations shown in the drawings, nor should the individual elements shown in the drawings be construed to be limited to the dimensions shown.

The asymptotic analysis presented above in regard to the Manhattan interconnection scheme indicates that it is necessary to bound the compute block connections to a constant if the total switches per compute block is to be contained to a constant independent of design size. Certain embodiments according to the present invention make use of the Mesh-of-Trees (MoT) topology briefly discussed above. In these embodiments, the MoT topology provides that the total switches per compute block is contained to a constant independent of design size. However, simply containing the switches to a constant is necessary but not sufficient to exploit additional metal layers, as described in additional detail below.

Embodiments according to the present invention may have multiples of the trees shown in the MoT topology, which may be placed along each row or column to increase the routing capacity of the network. According to embodiments of the present invention, the compute block connects to the leaf channels present in the MoT topology can be parameterized in a manner similar to the Manhattan C-box connections described above.

Figure 6:
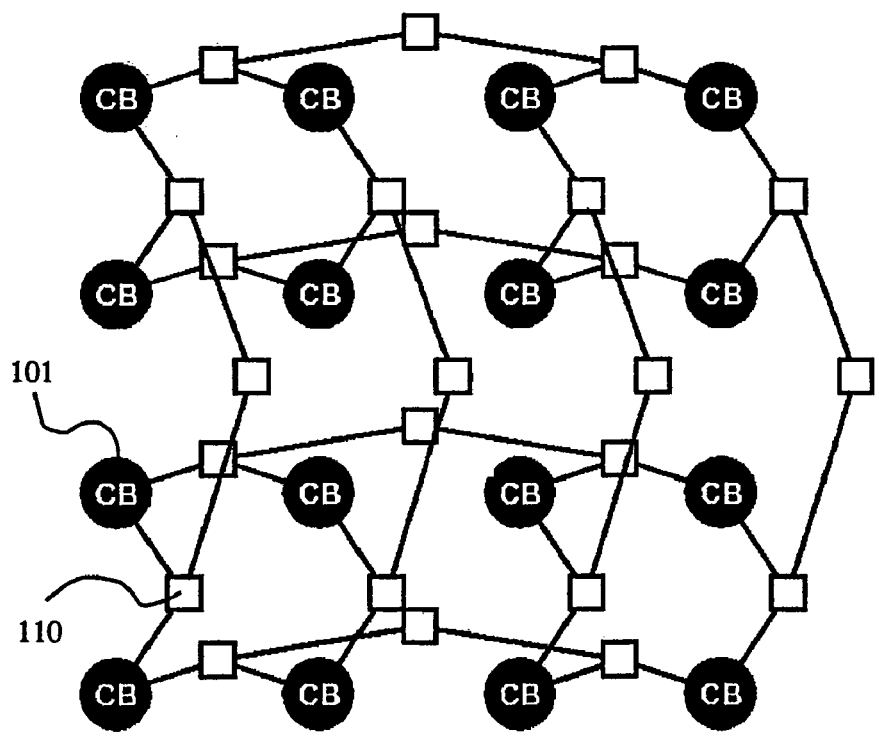
FIG. 6 (prior art) shows a Mesh of Trees topology as disclosed by Leighton.

The parameter C is used to denote the number of trees used in each row and column of the topology depicted in FIG. 6. The C-box connections at each "channel" in this topology are made only to the C wires which exist at the leaf of the tree. Hence, the number of switches per C-box in the multiple tree topology according to embodiments of the present invention is $C_{sw}=2F_c \cdot I \cdot C$.

In the MoT topology it is noted that there are no S-boxes per se. At the leaf level, connections between the horizontal and vertical trees are allowed. In the simplest sense, there are no switch boxes in this topology. However, each horizontal channel may be considered to connect to a single vertical channel in a domain style similar to that used in typical Manhattan switchboxes. Hence, the number of horizontal-to-vertical switches is $HV_{sw}=C$.

In certain embodiments according to the present invention, the corner turn at the connection between the horizontal and vertical channel may be fully populated. This would then allow any horizontal tree to connect to any vertical tree at the points of leaf intersection without changing the asymptotic switch requirements. In this alternative embodiment, the number of horizontal-to-vertical switches is $HV_{sw}=C^2$.

Within each row or column tree, a switch to connect each lower channel to its parent channel is needed. Such a switch can be implemented as simply as a single pass transistor and associated memory cell. Amortizing across the compute blocks which share a single tree, this topology provides that the number of such switches is $T_{sw}=1+\frac{1}{2}+\frac{1}{4}+\ldots <2$.

The horizontal channel holds C such trees, as does the vertical channel. Therefore, the number of switches for each compute block is:

$$B_{sw}=C_{sw}+HV_{sw}+2 \cdot C \cdot T_{sw}<C_{sw}+HV_{sw}+4 \cdot C$$

If the corner turn is populated as a single linear corner turn, the number of switches per compute block is:

$$B_{sw} < 2 \cdot F_c \cdot I \cdot C + 5 \cdot C < (2 \cdot F_c \cdot I + 5) \cdot C$$

Figure 3:
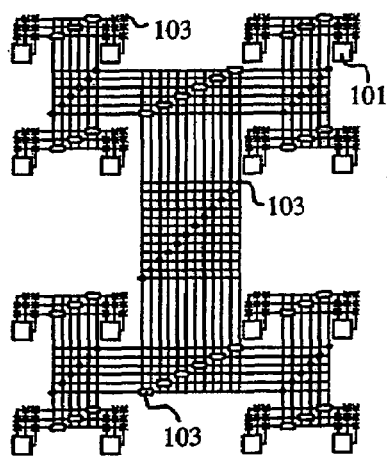
FIG. 3 (prior art) illustrates a Hierarchical Synchronous Reconfigurable Array.
Figure 4:
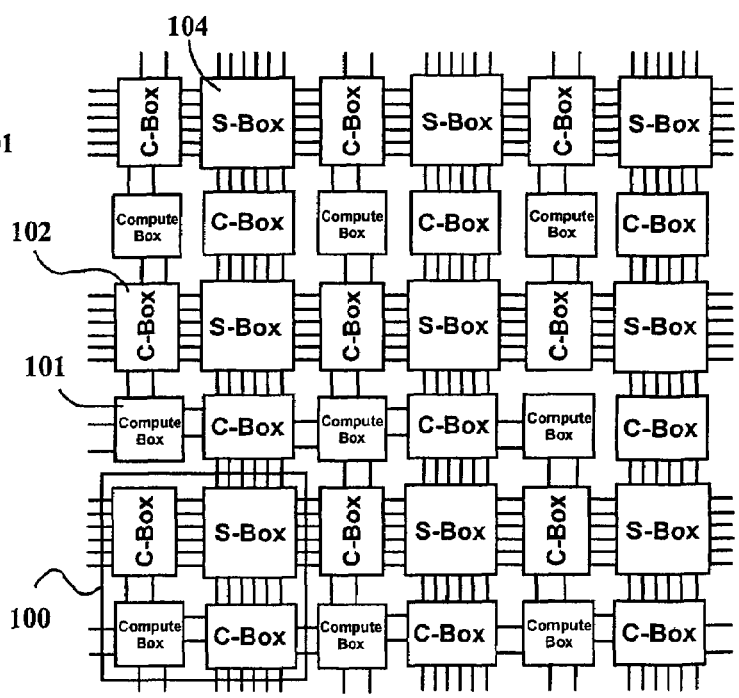
FIG. 4 (prior art) illustrates the Manhattan Interconnect Model.
Figure 5:
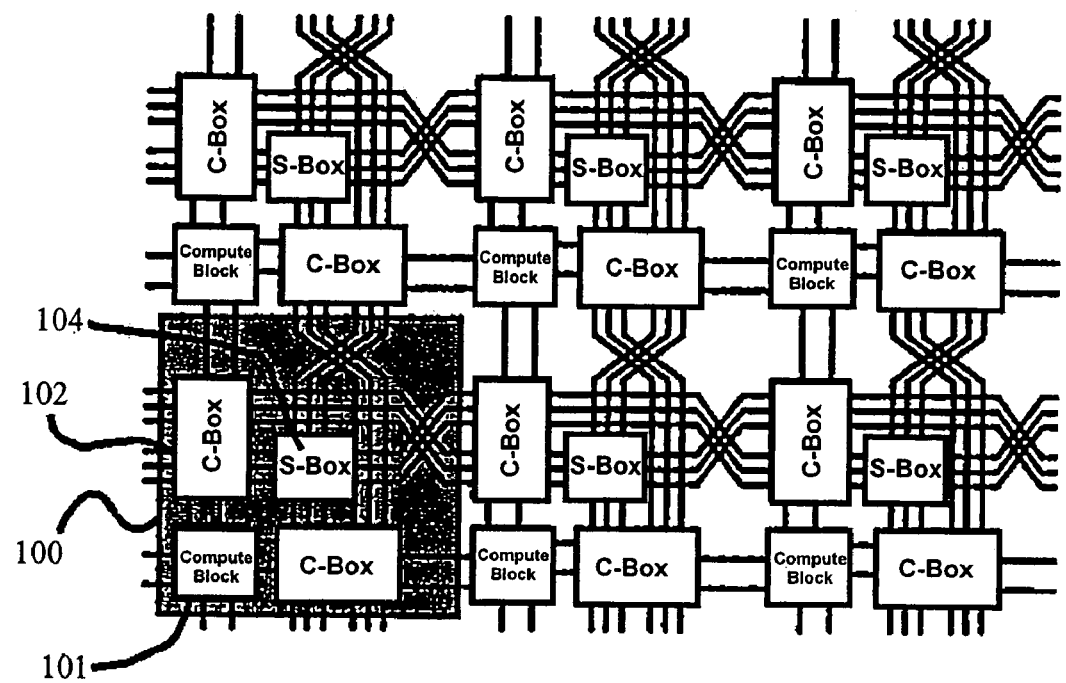
FIG. 5 (prior art) shows segmentation in the Manhattan Interconnect Model.

Hence, if C is bounded with increasing design size, the topology shown in FIG. 3 provides a constant number of switches per compute block.

Under Rent's Rule, the strict binary tree introduced by Leighton and depicted in FIG. 6 corresponds to a p=0.5. Embodiments according to the present invention may accommodate larger p values. Hence, certain embodiments grow the number of parents in the tree. As similarly described above, correspondence between W and N may be given by $W = CN^{(p-0.5)}$. A larger p can be supported with the mesh-of-trees embodiment by increasing the stage-to-stage growth rate. For example, if alternate tree levels double the number of parent segments, we can achieve p=0.75 (see, for example, FIGS. 12C-12D discussed in additional detail below). The number of tree levels is $\log_2$ of the length of each row or column, which is $\sqrt{N}$. The number of channels composing the root level of each tree is:

$$N_{ch}(N) = 2^{(\log2(\sqrt{N}/2))} = 2^{(\log2(\{fourth\ root\}\sqrt{N}))} = \{fourth\ root\}\sqrt{N}$$

The total bisection width at the root level is the aggregate channel capacity across all $\sqrt{N}$ channels of the design:

$$W_{bisect} = \sqrt{N} \cdot N_{ch}(N)$$

Therefore, the aggregate channel capacity is:

$$W_{bisect} = \sqrt{N} \cdot \{fourth\ root\} \sqrt{N} = N^{0.75},$$

which is a growth equivalent to providing p=0.75.

With p=0.75, the rate of wire growth has been increased, but the total number of switches per node remain asymptotically constant. Table 1 below shows the switches per node for p=0.75 according to an embodiment of the invention.

TABLE 1

Switches/Node for p = 0.75

| Leaf Span | Wires | Switches Per Wire | Switches Per Endpoint |
|---|---|---|---|
| 1 | 1 | 2 | 2 |
| 2 | 2 | 1 | 1 |
| 4 | 2 | 2 | 1 |
| 8 | 4 | 1 | ½ |
| 16 | 4 | 2 | ½ |
| 32 | 8 | 1 | ¼ |
| 64 | 8 | 2 | ¼ |
| . | . | . | . |
| . | . | . | . |
| . | . | . | . |

Based on Table 1, the total number of switches per node is $$T_{sw} = 2 + 1 + 1 + \frac{1}{2} + \frac{1}{2} + \frac{1}{4} + \frac{1}{4} + \ldots < 6.$$

Therefore, the total number of switches per compute block is: $B_{sw}(p=0.75) < (2 \cdot F_c \cdot I + 13) \cdot C$.

For any p<1.0 and a sufficiently large N, any p may be approximated by programming the stage-to-stage growth rate, and the number of switches per compute block remains asymptotically constant. The particular constant grows with p as indicated by the embodiments described above. According to embodiments of the present invention, a p that is equal or greater to a design p may be selected, and a network with constant switches per endpoint can be realized to provide a desired design bisection width. Techniques for performing the approximation of any p according to embodiments of the present invention are discussed in additional detail below.

The lower bound relationship of $$W \geq \frac{c_r N^p}{\sqrt{N}} = O(N^{(p-0.5)})$$

described above in relation to the Manhattan interconnect scheme is satisfied in embodiments according to the present invention with constant switches per compute block. However, it is noted that the lower bound relation relationship only guarantees that there are sufficient wires in the bisection, if they are used. The population scheme will determine whether or not enough of the wires can be used to keep C bound to a constant.

In the discussion of the embodiments above, constant switches per endpoint were described to show that the network could be laid out in area linear in the number of compute blocks. However, the discussion above does not show that constant switches per endpoint will provide that the use of additional wire layers will achieve a compact layout. For unconstrained logic, the prior art may teach that more wire layers may not always be usable. For example, G. A. Sai-Halasz in "Performance Trends in High-End Processors," *Proceedings of the IEEE,* 83(1):20-36, January 1995 indicate that wiring on an upper layer metal plane will occupy 10-15% of all the layers below it. Integrating this result across wire planes, indicates that there is a useful limit of 6-7 wiring levels.

However, the wiring topology according to embodiments of the present invention is quite stylized with geometrically increasing wire lengths. Therefore, such a topology does not exhibit the same saturation effect seen with unconstrained netlists. According to some embodiments of the present invention, a design which needs O(f(N)) bisection bandwidth can be laid out with only $O(\max(f(N)/\sqrt{N},1))$ wiring layers.

The wiring layer requirements can be first shown by examining the binary tree topology (i.e., p=0.5). In such a topology, each binary tree can be laid out along its row (or column) using $O(\log(l_{row}))$ wiring layers in a strip which is O(1) wide and runs the length of the row ($l_{row} = \sqrt{N}$).

Figure 7A:
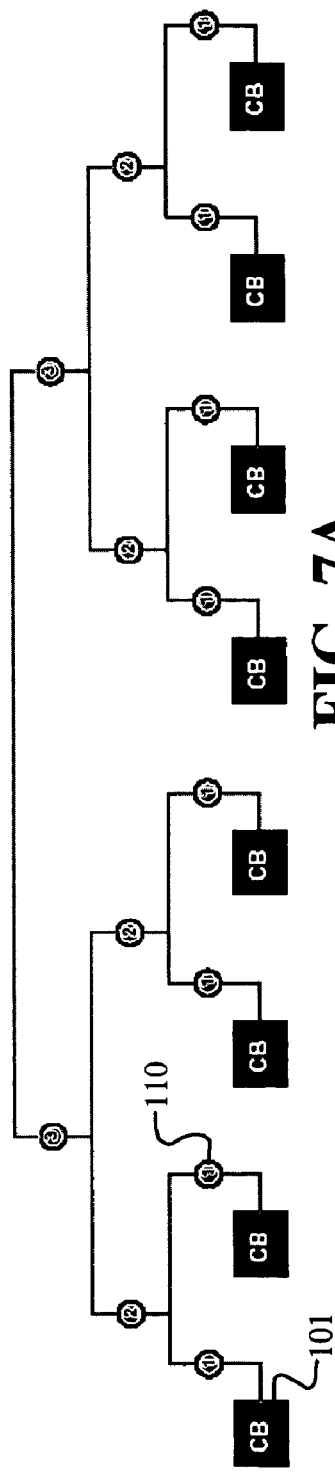
FIG. 7A shows a logical layout of one dimension of the embodiment depicted in FIG. 6.
Figure 7B:
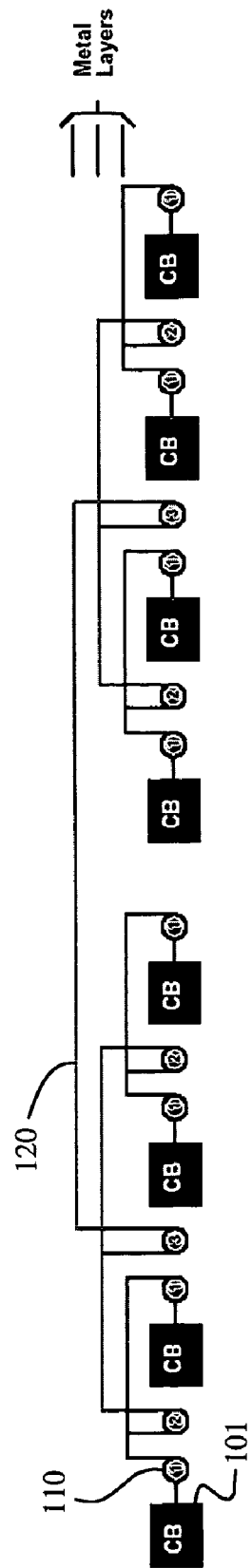
FIG. 7B shows a side view of the embodiment depicted in FIG. 7A when implemented in a physical embodiment having multiple metal layers.
Figure 7C:
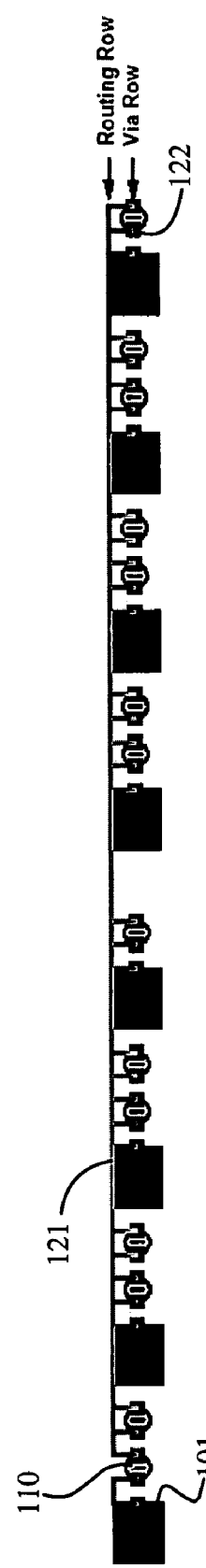
FIG. 7C shows a top view of the physical embodiment depicted in FIG. 7B.

FIG. 7A shows how the row (column) tree is mapped into a one-dimensional layout with O(logN) wiring layers. As shown in FIG. 7A, each subtree layout leaves one free switch location for an upper level switch 10. When two subtrees are combined, the switch 110 connecting them is placed in one of the two free slots, leaving a single slot free in the resulting subtree. In this manner, the recursive composition of subtrees can continue indefinitely; where the geometrically increasing via spacing allows the topology to avoid ever running out of via area on the lower levels of metalization. FIG. 7B shows a side view of an embodiment of the present invention implementing the logical layout shown in FIG. 7A. Therefore, as shown in FIG. 7B, each new tree level simply adds one additional wire run 120 above the existing wires. This p=0.5 case requires O(logN) metal layers, which is asymptotically optimal to accommodate the log(N) wires 120 which each tree contributes to each row or column. Note that the width of the column is made as wide as a via and a wire, all the wires may be brought up to the appropriate metal layer without interfering with the column wire runs. FIG. 7C shows a top view of the embodiment depicted in FIG. 7B with the routing row 121 spaced apart from the via row 122.

Note that FIG. 7C shows switches 10 disposed on a substrate layer with the compute blocks 101. However, one skilled in the art will understand that due to the use of the multiple layers of metalization according to embodiments of the present invention, the switches 110 may be replaced with one or more layers of programmable vias. That is, a via may be provided to the appropriate metal layer to provide a connection, or a via may be omitted where a connection is not needed. The via layers may be programmable or they may be simply fabricated when the device is fabricated, such as in an application specific integrated circuit. Specifically, different designs need only differ in a single mask layer; all other mask layers can be identical between the different designs.

In practice, the width of a switch is likely to be several wire pitches wide, consequently, several tree levels may be placed in a single metal layer and run within the width of the switch row. Hence, the number of wire layers needed for each row (or column) layout may be $\log_2(\sqrt{N})/r$ where r is the ratio of the switch width to wire pitch (strictly speaking one less than that to accommodate the via row). For example, if the switch width is $50\lambda$ and the wire pitch is $8\lambda$, 6 wires can be placed within the width of the switch. If one track is used for vias, 5 tree levels can be placed on each wire layer. Therefore, the number of layers needed to accommodate the row (column) tree is $\log_2(\sqrt{N})/5$.

Embodiments according to the present invention typically require both row and column trees. Hence, the row and column switches should be spaced out to accommodate the cross switches. Further, it is preferred that separate wire layers are assigned for the rows and columns. Therefore, the total number of wiring layers required for embodiments having both row and column trees is $2 \cdot \log_2(\sqrt{N})/r$. Additional wiring layers may also be required for power, ground and clock routing.

Figure 8:
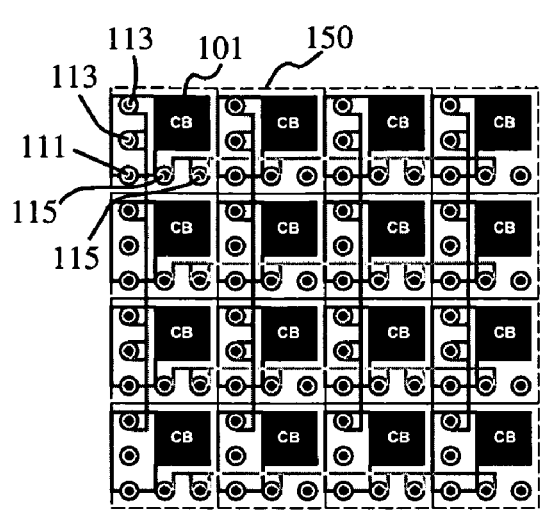
FIG. 8 shows a minimal Mesh of Trees layout according to an embodiment of the present invention.
Figure 8A:
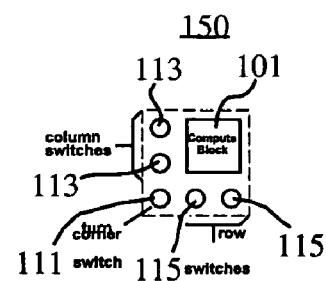
FIG. 8A shows a base tile used in the minimal layout shown in FIG. 8.
Figure 9:
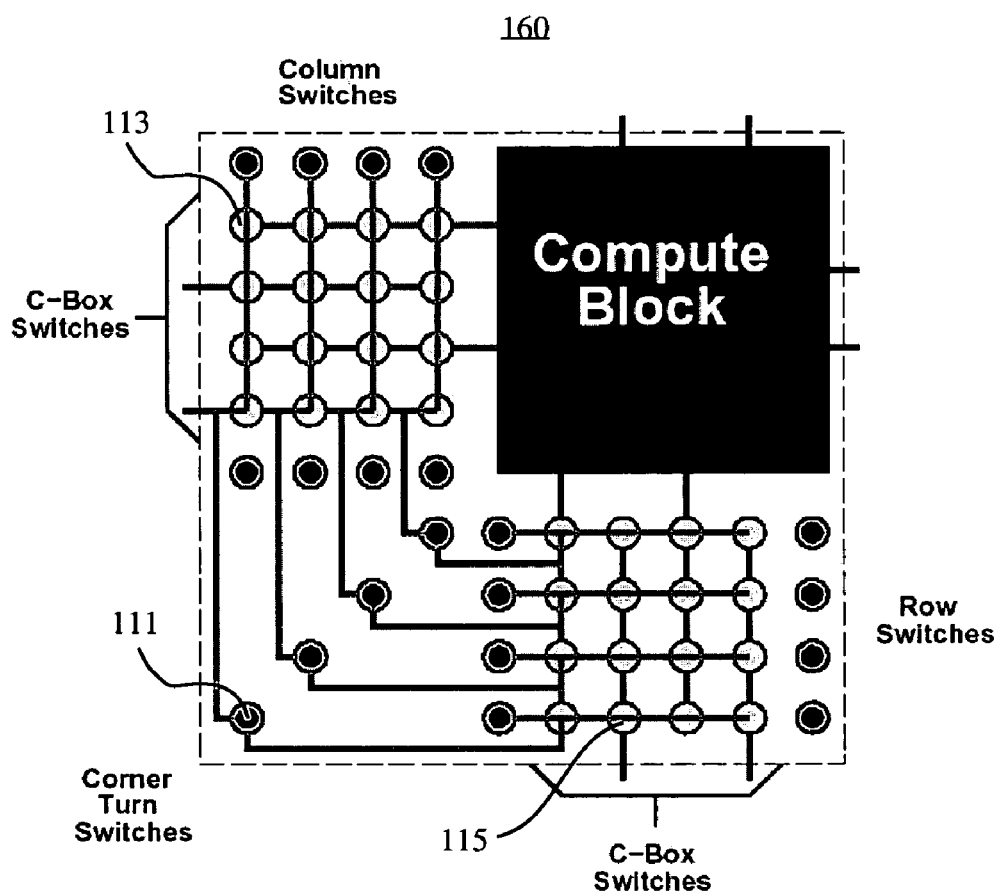
FIG. 9 shows a base tile for a larger Mesh of Trees layout.

FIG. 8A shows a base tile 150 for a minimal layout with a single tree in each row and column channel. Hence, the base tile 150 comprises a compute block 01, one or more column switches 13, one or more row switches 15, a one or more corner turn switches 111. FIG. 8 shows the layout of several base tiles in this minimal arrangement. Preferably, several trees (C>1) are used in each row and column. Therefore, preferred embodiments may require C-box switches. FIG. 9 shows the base tile 160 for a larger network configuration having more than one tree in each row and column.

As indicated above, other embodiments according to the present invention may have $0.5 \leq p < 1.0$. The layout scheme described above also works for this case. With $0.5 \leq p < 1.0$ there will not always be exactly half as many switches on each immediately successive tree level. However, as long as $p < 1.0$, there are a number of tree stages over which the number of switches will be half the number of switches in the preceding group of tree stages. By grouping the switches into these groups, the same strategy shown for the binary tree case can be used for non-binary tree embodiments.

Figure 10:
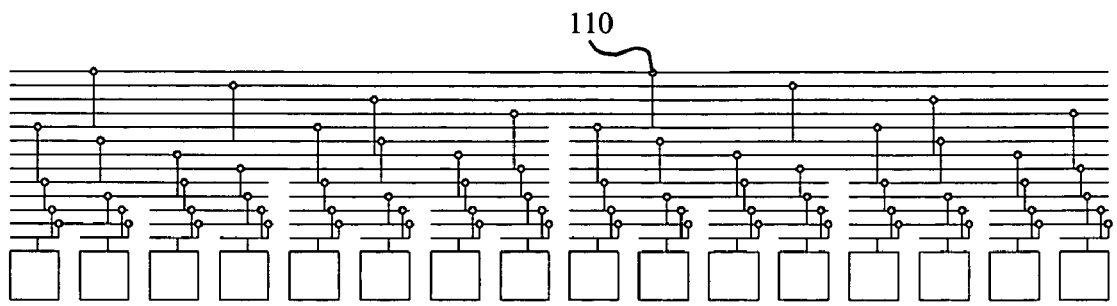
FIG. 10 shows a one dimensional slice of an embodiment of the present invention using the Mesh of Trees layout with p=0.75.

FIG. 10 shows the switch arrangement for the aforementioned p=0.75 case. It should be clear from the layout tree diagrams that the switches 110 can be shuffled to the base layer as shown in FIGS. 7A-7C. In this case, as shown in Table 1, there will be 6 switches between every pair of compute blocks. However, up to a span of 16 endpoints, only 5 switches between compute blocks are needed (see, for example, Table 1). Beyond that, each pair of stages contributes half as many switches as the previous pair of stage, resulting in a total of one more switch per endpoint. As each additional pair of stages are composed, half of the remaining slots in each span are left with space for switches from the next span. As shown in FIG. 10, the uplinks can be spread across the entire width of the stage. This filling can continue indefinitely just as the p=0.5 described above.

Figure 28:
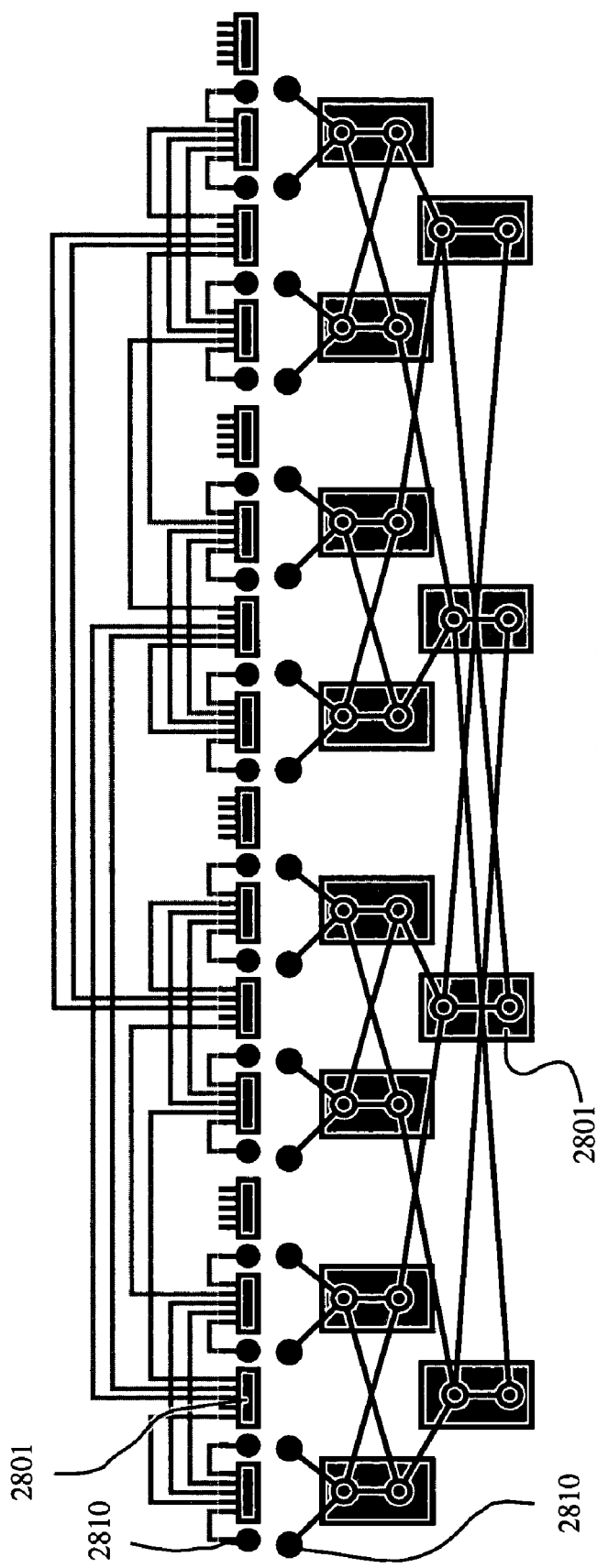
FIG. 28 shows an alternative one dimensional slice of a p=0.75 embodiment of the present invention in which macro switches and the associated layout strategy are used.

FIG. 28 shows an alternative switch arrangement for the p=0.75 case. As shown in FIG. 28, the switches in two switch levels that provide the power of two reduction shown in FIG. 10 are combined into a macro-switch 2801 and the macro-switches 2801 are then laid out in a simple binary tree. This has the effect of shrinking every other level of the tree into the level immediately below it. As shown in FIG. 28, a lowest level macro switch 2801 is directly coupled to a processing element 2810, while macro switches 2801 at upper levels will be coupled to macro switches 2801 at lower levels.

Figure 11:
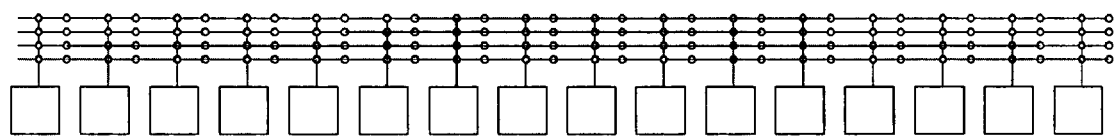
FIG. 11 (prior art) shows a one dimensional slice of the layout shown in FIG. 10 using a Flat Manhattan topology.

FIG. 11 shows the topology depicted in FIG. 10 implemented in a Flat Manhattan topology. As described above, the embodiment of the present invention depicted in FIG. 10 accommodates the bisection width of 4 using only a single base domain, while the Manhattan topology requires at least one domain for every wire in the bisection. This demonstrates how embodiments according to the present invention may allow a smaller C than the Manhattan channel width (W). Asymptotically, the embodiment depicted in FIG. 10 will require 6 switches per endpoint for this arrangement, while the Manhattan topology shown in FIG. 11 requires 8 to accommodate this channel width of 4. For larger spans, the effect increases. For a span of 32 nodes, an embodiment according to the present invention can accommodate a bisection bandwidth of 8 while still using at most 6 switches per endpoint. On the other hand, a Manhattan topology with a bisection width of 8 will require 16 switches per endpoint.

The total number of metal layers is asymptotically optimal. That is, for p>0.5, we must have $O(N^{(p-0.5)})$ wires in the top level of the channel to accommodate bisection requirements. To make the channels $O(1)$ wide, we must use $O(N^{(p-0.5)})$ layers to accommodate the bisection requirements. The channel should accommodate all the wire levels of the embodiments according to the present invention. Since there are geometrically fewer wires in each lower level of each row or channel the MoT tree according to the present invention when p>0.5, when the total number of wires across all levels in each row or column tree is summed, the total wire count is simply a constant factor times the number of wires in the top channel. So, the total number of wire layers is $O(N^{(p-0.5)})$.

Switch delay is typically asymptotically logarithmic in distance between the source and the destination. In embodiments according to the present invention, a route simply needs to climb the tree to the appropriate tree level to link to the destination row or column, then descend the tree. The stub capacitance associated with each level of the tree should be constant. Some embodiments of the present invention provide that there are a constant number of switches (drivers or receivers) attached to each wire segment, regardless of its length. This is in contrast with the flat, Manhattan interconnection scheme previously described. In that scheme, the number of switches attached to a long wire is proportional to the length of the wire. Hence, some embodiments according to the present invention provide an added benefit of minimizing the switch capacitance associated with long wire runs. However, buffered switches may be used to achieve minimum delay and to isolate each wire segment from the fanout that may occur on a multipoint net.

According to embodiments of the present invention, it is preferred to buffer the long wire runs in order to achieve linear delay with interconnect length and minimize the delay travelling long distances. However, such buffering may be implemented with the insertion of buffers at fixed distances, which can reduce the benefits of the convenient geometric switching property identified. Technological advances that provided linear delay with distance without requiring repeaters (e.g. optical, superconducting wires) could provide the desired performance without buffering.

Embodiments according to the present invention may have variations that provide the desirable asymptotic characteristics described above, while providing additional opportunities for lower absolute switching and wiring requirements. These variations may include embodiments incorporating arity, shortcuts, corner turns, and staggering.

Figure 12A:
FIGS. 12A-12D show Mesh of Trees layouts according to embodiments of the present invention with various arity and p values.
Figure 12B:
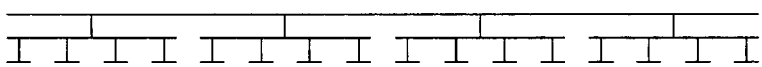
Figure 12C:
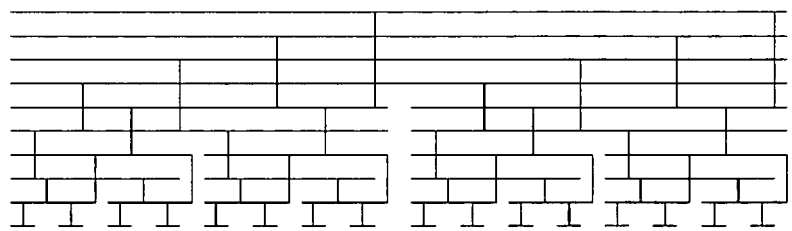
Figure 12D:
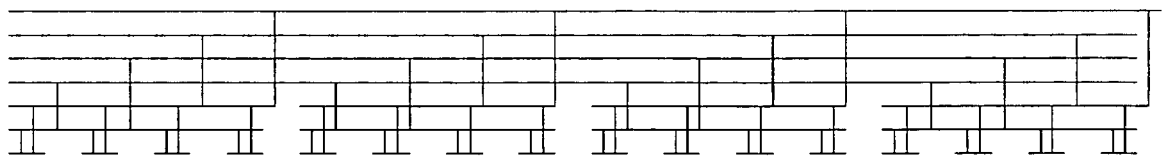

Arity refers to the branching factor of the tree, i.e., the number of children segments associated with each parent segment in the tree. FIG. 12A-12D shows arity-2 and arity-4 trees according to embodiments of the present invention. FIG. 12A shows an embodiment with a Rent Growth rate of $p=0.5$ and arity of 2 and FIG. 12B shows an embodiment with $p=0.5$ and an arity of 4. FIG. 12C shows an embodiment with a Rent Growth rate of $p=0.75$ and an arity of 2 and FIG. 12D shows an embodiment with $p=0.75$ and a arity of 4. Higher arity makes the trees flatter. This will reduce the number of switches in a path, but will increase the capacitance associated with each segment along the path. Higher arity reduces the wires per domain, but can increase the number of domains needed to route a design. In particular, higher arity can force a number of short connections which would have been disjoint to now overlap.

In the extreme, each channel could be flattened into an arity $\sqrt{N}$ tree. This would be equivalent to building a crossbar along each column of tree. Such a crossbar would have channel width $\sqrt{N}$, worse than the Manhattan topology, forcing a total number of switches $N^{1.5}$. So, clearly, the arity can be made too large to exploit the structure of MoT structure. At the other extreme, arity-2 designs may have too many switches in the path and more intermediate levels than are useful. Preferably, the best balance point between these extremes is found to allow for the best exploitation of the Mesh of Trees (MoT) structure according to embodiments of the present invention.

For any arity, any Rent Exponent growth rate can be approximated by selecting the appropriate sequence of channel growths. Let a=arity, l=levels, $g_i$=growth at level i. A MoT structure with l levels has a total number of nodes, N:

$$N=(a^l)^2=a^{2l}$$

The width of the top channel is:

$$w(l) = C\left(\prod_{i=0}^{l} g_i\right)$$

where C is the number of tree domains, as before. The total bisection width, BW, or a level 1 in the structure is:

$$BW(l)=w(l)\cdot\sqrt{N}=w(l)\cdot a^l$$

Using the Rent Relation equation described above, the bisection width is found as follows:

$$BW(l) = c_r N^p = w(l)\cdot a^l c_r(a^{2l})^p = C\left(\prod_{i=0}^{l} g_i\right)\cdot a^l$$

Hence, it can be seen that the tree domain C plays a similar role to the Rent constant multiplier $c_r$. To examine growth effects, these constants can be dropped, understanding that the constants can be used to provide a constant shift on the bandwidth curves.

$$a^{2lp} = \left(\prod_{i=0}^{l} g_i\right)\cdot a^l$$

$$2lp\log a = \log\left(\prod_{i=0}^{l} g_i\right) + \log a$$

$$p = \frac{\log\left(\prod_{i=0}^{l} g_i\right)}{2l\log a} + \frac{1}{2}$$

For $p=0.5$, $g_i=1$ for all i. For $p=0.75$, the $g_i$ sequence may be selected to correspond to the arity. For $a=2$, even $g_i$'s may be set to 2 and odd $g_i$'s may be set to 1. See, for example, FIG. 12C. Therefore, from the equation above:

$$w(l, p-0.75) = C\left(\prod_{i=0}^{l} g_i\right) = C\cdot 2^{(l/2)}$$

Therefore, from the equation for the Rent Growth Rate above:

$$p = \frac{\log 2^{(l/2)}}{2l\log 2} + \frac{1}{2} = \frac{3}{4}$$

For $a=4$, all the $g_i$'s may be 2. See, for example, FIG. 12D. So, from the equation above:

$$p = \frac{\log 2^{(l)}}{2l\log 4} + \frac{1}{2} = \frac{3}{4}$$

Table II below shows the growth sequences that may be used to achieve various arity and Rent exponent designs in accordance with embodiments according to the present invention.

TABLE II

| Arity | p | Growth Sequence |
| --- | --- | --- |
| 2 | 0.67 | (2 1 1)* |
| 2 | 0.75 | (2 1)* |
| 3 | 0.65 | (2 1)* |
| 3 | 0.81 | (2)* |
| 4 | 0.625 | (2 1)* |
| 4 | 0.67 | (2 2 1)* |
| 4 | 0.75 | (2)* |
| 5 | 0.6 | (2 1)* |
| 8 | 0.67 | (2)* |

Amortized across the $\sqrt{N}$ endpoints sharing a single horizontal or vertical domain tree, each endpoint will have a number of tree switches:

$$T_{sw} = g_0 + \frac{g_0 \cdot g_1}{a} + \frac{g_0 \cdot g_1 \cdot g_2}{a^2} + \frac{g_0 \cdot g_1 \cdot g_2 \cdot g_3}{a^3} + \ldots$$

Figure 13:
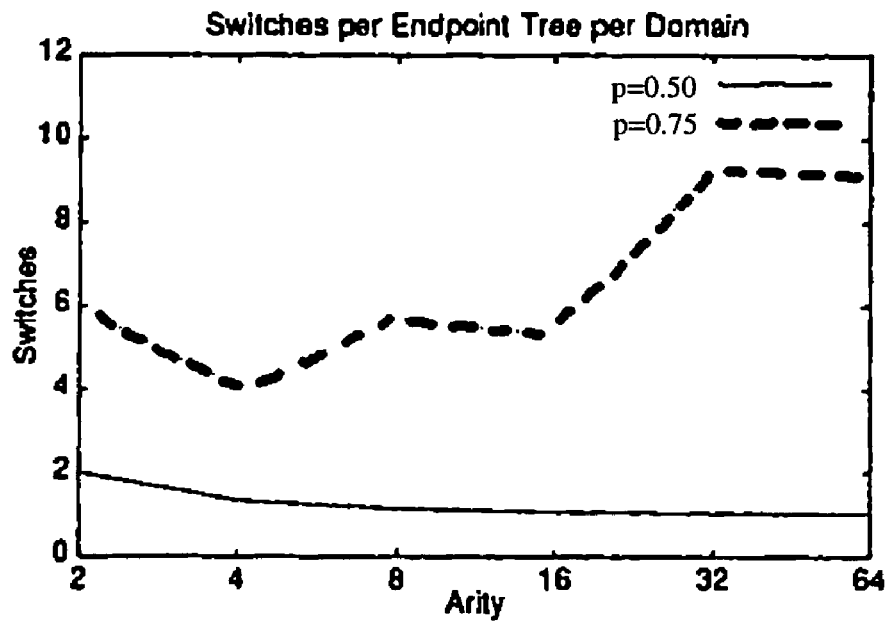
FIG. 13 shows a graph that depicts how the number of switches per domain may vary with the arity according to some embodiments of the present invention.

This equation is basically a generalization of the arity-2, p-specific switching counting equations presented above. Assuming the $g_i$'s are powers of two, FIG. 13 shows how the number of switches per domain varies with the arity. For p=0.5, higher arities have fewer stages and hence less switches per endpoint, as should be clear from FIGS. 12A and 12B. For p>0.5, there are two competing effects. Higher arities have fewer stages, but the higher airity results in flattening that forces each uplink to connect to a greater number of parents. As shown, this results in a minimum number of switches per domain around an arity of 4. The odd powers of two end up being less efficient than the even powers in the discrete approximation to p=0.75, causing the non-monotonic growth depicted in FIG. 13. However, it is noted that the number of tree domains may change for larger arities.

In general, it is noted that the number of wires per domain, $w_x$, is the sum of the channels required at each level of each base tree ($w_{ch}(l)$, where l is the tree level):

$$w_x(l) = w_{ch}(l) + w_{ch}(l-1) + w_{ch}(l-2) + \ldots$$

$$= \left(\prod_{i=0}^{l} g_i\right) + \left(\prod_{i=0}^{l-1} g_i\right) + \left(\prod_{i=0}^{l-2} g_i\right) + \ldots$$

$$= \left(\prod_{i=0}^{l} g_i\right)\left(1 + \frac{1}{g_l} + \frac{1}{g_l \cdot g_{l-1}} + \ldots\right)$$

For p>0.5, it will always be the case that there are $g_i$'s greater than one such that this $$\frac{1}{g_i}$$

series summation converges to a constant as l approaches infinity. For arity 2 and p=0.75, the series converges to 3.5, while for arity 4 and p=0.75, it converges to 2. FIGS. 12A-12D shows this effect graphically. For all p's, higher arity implies higher growth rates and fewer terms in the sum resulting in fewer total wire channels. However, it is noted that sometimes a higher arity will require no more base channel than arity 2, resulting in a net decrease in total wires. Other times, a factor of $$\frac{a}{2}$$

more base channels than arity 2 may be required, resulting in an increase in total wires.

It is noted that the total channel widths ($W_x$) according to embodiments of the present invention are typical larger than the Manhattan channel widths (W). The worst-case $W_x$ for an arity=5, p=0.6 embodiment is 90 divided into 9 wires used by each of 10 domains. Conservatively assuming a minimum size $50\lambda \times 50\lambda$ switch and an $8\lambda$ wire pitch, the 9 wires in each domain can be routed over the width of a single switch in two metal layers, since r=6 wire pitches per layer can be obtained. Two wire layers for horizontal channel routing plus two layers for vertical channel routing provides that only 4 routing layers are needed to layout this design. Therefore, it can be seen that it is the switch area which determines device density, not the wiring. Consequently, since embodiments of the present invention may reduces switches at the expense of wires compared to the Manhattan topology, the result may be a net decrease in device area.

A concern with embodiments according to the present invention when compared with pure Manhattan designs may be that some nodes which are physically close in the layout may not by logically close in the tree. Hence, a worst case may be that a wire would be required to travel through 2 $\log_a(\sqrt{N})$ switches, while only two switches may be required in a Manhattan topology or in another embodiment according to the present invention, if the connection were aligned differently with respect to the tree.

Short connections which bridge hierarchy gaps may be used to reduce the likelihood that a signal needs to be routed higher in the tree than $O(\log_a(\text{Manhattan Distance}))$. This also provides that the total distance traversed is within a constant factor of the Manhattan Distance between the source and sink. Hence, shortcuts may be used to shorten wire runs. Shortcuts may also be used to reduce the growth of the root bandwidth.

The breaks between tree segments may create discontinuities in the array where leaves are physically close but logically in different subtrees. These breaks may also lead to bandwidth discontinuities along each row and column. For p>0.5, these discontinuities do not affect the asymptotic wiring requirements, but may affect the practical wiring requirements by a constant factor. For example, returning to the p=0.75 example, the root bandwidth for a row or column tree grows as {fourth root}$\sqrt{N}$, as described above. If all the channels at all levels are considered:

$$N_{total}(N) = N_{ch}(N) + N_{ch}\left(\frac{N}{4}\right) + N_{ch}\left(\frac{N}{16}\right) + \ldots$$

$$= \sqrt[4]{N} + \sqrt[4]{\frac{N}{4}} + \sqrt[4]{\frac{N}{16}} + \ldots$$

$$= \sqrt[4]{N}\left(1 + \frac{1}{\sqrt{2}} + \frac{1}{2} + \frac{1}{2\sqrt{2}} + \ldots\right) \le$$

$$N_{ch}(N)\left(\frac{1}{1 - \frac{1}{\sqrt{2}}}\right) < 3.5 N_{ch}(N)$$

Hence, the growth of the root bandwidth may be a non-trivial constant factor.

Figure 14A:
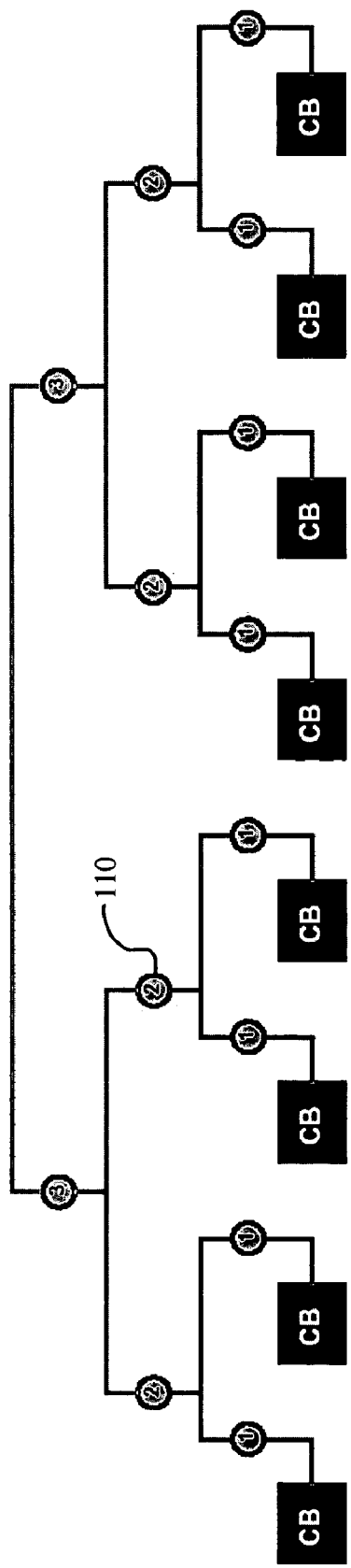
FIG. 14A shows an embodiment according to the present invention with no shortcuts.
Figure 14B:
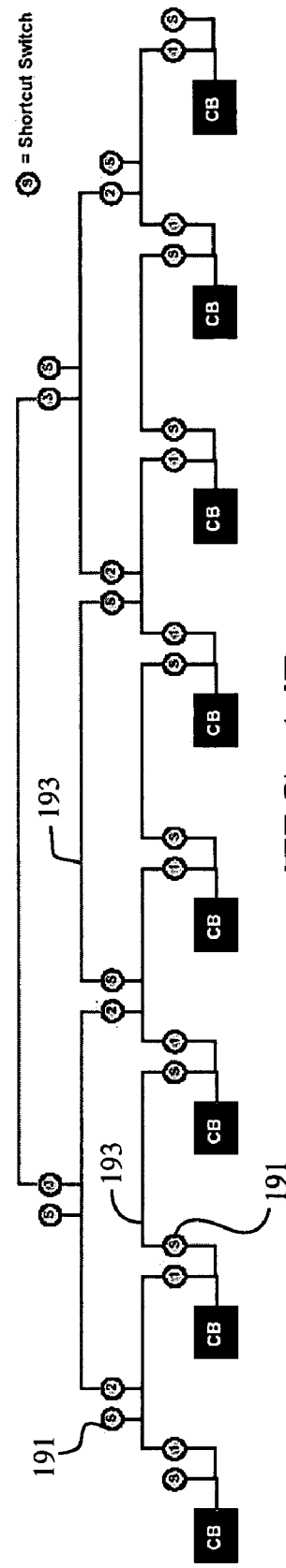
FIG. 14B shows an embodiment according to the present invention in which shortcuts are used.
Figure 29:
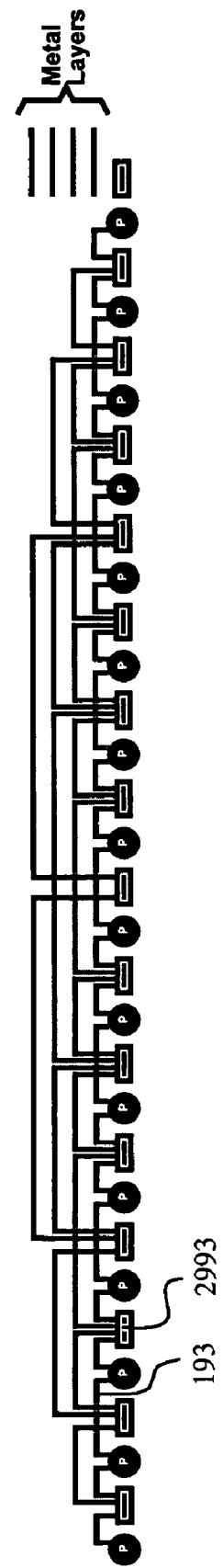
FIG. 29 shows an alternative one dimensional slice of the present invention incorporating shortcuts in which macro switches are used along with the associated layout strategy.

A single switchpoint may be added between each pair of adjacent segments in the same tree at the same level of hierarchy without changing the asymptotic switch requirements. See, for example, FIGS. 14A and 14B. FIG. 14A shows an embodiment according to the present invention without the use of shortcut switches, while FIG. 14B shows the use of shortcut switches 191 and shortcut runs 193. In FIG. 14B, one shortcut switch 191 is added next to each tree switch 110, so the established layout scheme easily accommodates the shortcut switches 191. Essentially, the shortcut switches 191 simply add another $T_{sw}$ horizontal and vertical switches to each compute block. Once the shortcut switches are added, all things which are physically close are also logically close and there are no bandwidth discontinuities in the array. However, while shortcuts may reduce the number of domains and total wiring, the use of shortcuts may result in a net increase in switch count. FIG. 29 shows how the shortcut runs 193 may be implemented in multiple metal layers and using 4-way switches 2993. FIG. 29 also shows that the shortcut switches may be placed without losing the advantages of the interconnect switch placement discussed above.

Full shortcut population can double tree switches per domain required for an arity 2 embodiment according to the present invention. The general increase is:

$$T_{\text{sw\_short}} = \left(\frac{a+2}{a}\right) T_{sw}$$

That is, one switch may be added at each end of an arity group in addition to the a switches already providing up tree connections. The equation may actually be $$\left(\frac{a+1}{a}\right),$$

since only one switch is needed to enable or disable the shortcut, so only half a switch needs to be charged to each of the two segments being connected. However, in higher portions of the tree, a single switch could result in a long wire stub. Therefore, it may be advantageous to use one switch at lower levels and two switches at higher levels.

Figure 14C:
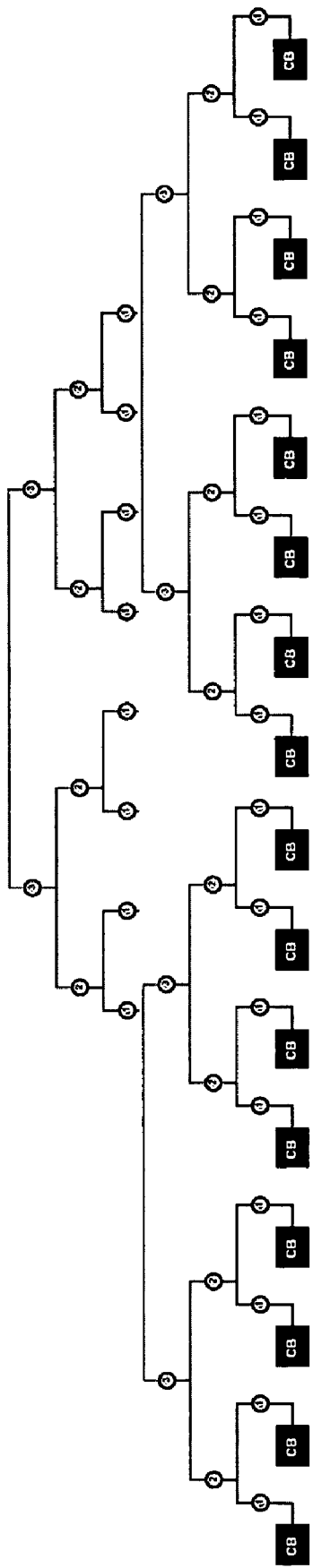
FIG. 14C shows an embodiment according to the present invention in which staggering is used.

Other embodiments according to the present invention may not use shortcuts on all trees in a row and column and on all tree levels. Other embodiments may stagger the trees within the same row or column, which may be used in place of shortcuts to provide desired logical closeness. That is, most of the worst tree alignment effects may be reduced simply by staggering the domains relative to each other. This way, if there is a bad break on one tree, there may be a more favorable sibling relationship on another tree. FIG. 14C shows an embodiment according to the present invention in which staggering is employed.

As described in more detail below, the minimum number of tree domains needed to exit all five IOs for a 4-LUT is C=3, so there should always be multiple domains available for staggering. With larger clusters, the minimum domain size increases. Staggering the domains requires no additional switches and will often reduce the number of domains needed to route a design.

In some embodiments according to the present invention, some corner turns can be added at higher levels of the tree hierarchy, but the property that each compute block tile contains a constant number of switches independent of the design size is preferably maintained. If every level is allowed to connect at every switch box, the resulting network may have too many switches ($O(N^{2p})$ per compute block when p>0.5).

However, corner turns may be placed between the wire segments whose switch connection are associated with the same endpoint node. That is, according to embodiments of the present invention, the switches in each row and column can be distributed such that there are a constant number of switches associated with each leaf node. If those segments which switch at the same node are connected, only the constant switch count at each node will be increased. See, for example, FIG. 8, which shows an embodiment of the present invention with non-leaf corner turns. For example, a single switch may be placed between the horizontal and vertical segments in the same tree domain making up links at this stage. This additional corner turn switch provides that there are three switches where before there were two. Hence, the number of switches per compute block becomes:

$$B_{sw} = C_{sw} + HV_{sw} + 3 \cdot C \cdot T_{sw}$$

Embodiments according to the present invention may have multiple LUTs that are grouped into each leaf compute block in the Island Style, as described in V. Betz, J. Rose, and A. Marquardt. *Architecture and CAD for Deep-Submicron FPGAs*. Kluwer Academic Publishers, 101 Philip Drive, Assinippi Park, Norwell, Mass., 02061 USA, 1999. Such a grouping does not change the asymptotic switching and wiring requirements for either the Manhattan interconnect scheme described above or embodiments according to the present invention, but it may change the switching constants.

Embodiments according to the present invention may also use buffered or registered switch points without significantly changing the asymptotic switching and wiring requirements discussed above. That is, children, shortcut, and/or parent connections can be grouped together into a single, local switching block. This allows point-to-point signals to be driven between blocks. The switching blocks can be placed, so that there is a single such block per compute block and the number of wiring layers remains the same as in the unbuffered case.

Figure 15:
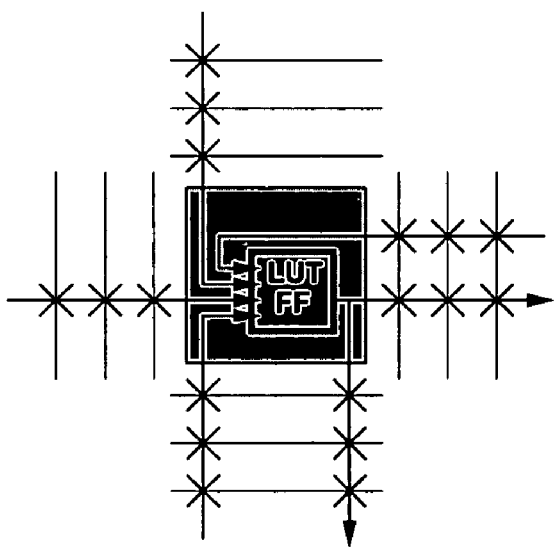
FIG. 15 shows the logic block IO structure used in analyzing the performance of some embodiments according to the present invention.

Analysis was performed to compare the channel, domain and switch requirements between designs using the traditional Manhattan interconnect scheme described above and designs using embodiments according to the present invention. In the analysis, the logic block input/output structure was modeled using the structure shown in FIG. 15. As shown in FIG. 15, each of the 4 LUT inputs appears on a single side of the logic block ($T_{in}$=1), the output appears on two sides ($T_{out}$=1), and both are filly populated ($F_c$=1).

Figure 16A:
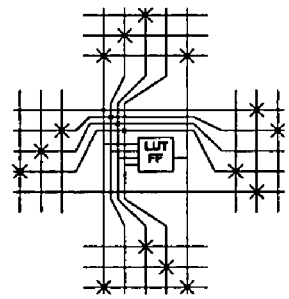
FIG. 16A shows the logic block IO structure used in analyzing the performance of some embodiments according to the present invention with T=1.

In the analysis, routed designs were produced using both Manhattan routing and routing according to embodiments of the present invention. In the Manhattan routing, designs were produced using both a uniform, length-4 segment and a base length-1 segment. In designs routed according to embodiments of the present invention, the designs used a T=1, as shown in FIG. 16A. The designs also used upper-level corner turns and no shortcuts. The number of base channels, C, were allowed to float so that the minimum number of channels to route the designs for various p values could be determined.

The analysis generally found that designs routed according to embodiments of the present invention had sufficiently small C so as to require fewer total switches that designs routed according to the Manhattan interconnect scheme. In the designs routed according to embodiments of the present invention, the C's were uniformly small, many being as low as 3 for p=0.75. Increasing the IO population, using shortcuts, and/or staggering reduced most of the other designs to C's of 3 or 4.

It is noted that the C required for most designs is generally driven by three factors: 1) bisection width; 2) number of distinct signals which must enter a channel; and 3) domain coloring limitations. A sufficiently large p value can generally accommodate bisection needs. See, for example, FIG. 10 described in additional detail above. For channel entrance, note that a fully used K-LUT with a single output needs to have k+1 potentially distinct signals enter one of the four channels which surrounds it. Further note that it shares each of those channels with 2 other k-LUTs which have similar requirements. Consequently, the channel entrance lower bound is:

$$C_{lb} \geq \left\lceil \frac{2 \cdot (k+1)}{4} \right\rceil$$

Therefore, for k=4, $C_{lb}$=3. Finally, since embodiments according to the present invention may maintain the domain topology typical of the Manhattan FPGA interconnect, these embodiments may have colorability limitations. Colorability limitations are described in Y. -L. Wu, S. Tsukiyama, and M. Marek-Sadowska. Graph Based Analysis of 2-D FPGA Routing. *IEEE Transactions on Computer-Aided Design of Integrated Circuits and Systems*, 15(1):33-44, January 1996. However, the results of the analysis indicate that colorability issues are not a major issue since the analysis showed the achievement within one channel of the channel entrance lower bound on the routed designs.

Figure 16B:
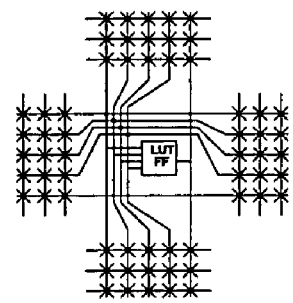
FIG. 16B shows the logic block IO structure used in analyzing the performance of some embodiments according to the present invention with T=4.

During the analysis, population schemes of embodiments according to the present invention from fully connecting the IOs to each channel down to connecting each base channel domain only once were considered. That is, each input or output was connected with TxC switches and those switches were balanced over both sides and base channel domains. FIG. 16A shows the distributed IO population with T=1 and W=3. FIG. 16B shows the distributed to population with T=4 and W=3. The T=1 case, where the channel connections are rotated around the four sides of the block, generally achieves the minimum switch count. Higher T values, while generally increasing the number of switches required, may reduce the number of base channels required.

As noted previously, larger p's will imply greater bisection bandwidth for a given base channel size and greater switches. Increasing p will tend to decrease C. Therefore, for a given design, the question is whether the decrease in base channels is sufficient to compensate for the increased switch requirements per channel for the larger p value. In general, exactly matching p for designs implemented with embodiments of the present invention with the p for the placed design should be the minimum point. Since different designs likely have different placed p's, the designs may be minimized by different p values. However, designs having p=0.67 or p=0.75 generally provide the best results.

Other modifications to embodiments of the present invention may provide different results, as discussed above. Including upper level corner turns in embodiments according to the present invention generally reduces the number of base channels required. However, the total number of switches required is roughly the same whether upper level corner turns are used or not. Including shortcuts will generally reduce the number of base channels, but the additional switches per logic block are not sufficiently compensated by the reduction in channels. Consequently fully populated shortcuts usually result in a net increase in switching requirements. As discussed above, the base channel domains may be staggered with respect to each other. If there is more than one base channel in each row and column, they may be offset from each other to minimize the discontinuity effects discussed above. For some designs, staggering saves a base channel, resulting in a 10% to 20% reduction is switch count. For other designs, tree alignment issues will require a few extra switches per domain if staggering is used.

Overall, the results from the analysis comparing different embodiments of the present invention using the MoT topology compared with a Manhattan mesh designs verified small C values that showed no signs of growing and total switch requirements that were about 26% smaller than those of conventional mesh designs. Further, it was found that arity-4 trees generally required the least absolute switches with less than 70% of the wiring requirements of arity-2 trees.

Embodiments according to the present invention may be modified to such an extent that the modified embodiments are implementations of the prior art topologies discussed above and, conversely, those topologies may be modified to result in the Mesh of Trees topology used by embodiments according to the present invention. For example, A Mesh of Trees topology with complete flattening, shortcuts, full corner turns (including among shortcuts) with the hierarchy truncated may be considered as being a Manhattan topology. Hence, the addition of a hierarchy to a Manhattan topology moves one towards the Mesh of Trees topology, while the use of shortcuts and corner turns in a Mesh of Trees topology moves one towards a Manhattan topology. Another example is that a Mesh of Trees topology with select Corner Turns may be considered as containing certain configurations of a HSRA topology, while a HSRA may be considered as containing certain configurations of a Mesh of Trees topology. These relations may assist a designer in determining what network to use in routing a design and to assist in scaling up designs.

As described in additional detail below, a Mesh of Trees topology may be mapped to a linear Tree of Meshes topology. There is a direct mapping between a MoT with a given growth rate p and an HSRA/BFT with the same growth rate. In F. T. Leighton, "New lower bound techniques for vlsi," in *Twenty-Second Annual Symposium on the Foundations of Computer Science*. IEEE, 1981, the observation is made that a MoT topology can be embedded in a ToM where both are implicitly assumed to have p=0.5. According to embodiments of the present invention, it is shown how to perform this mapping even if the ToM is linearly populated with switches as in the BFT or HSRA and that the mapping will hold for $0.5 \leq p \leq 1.0$.

Figure 17:
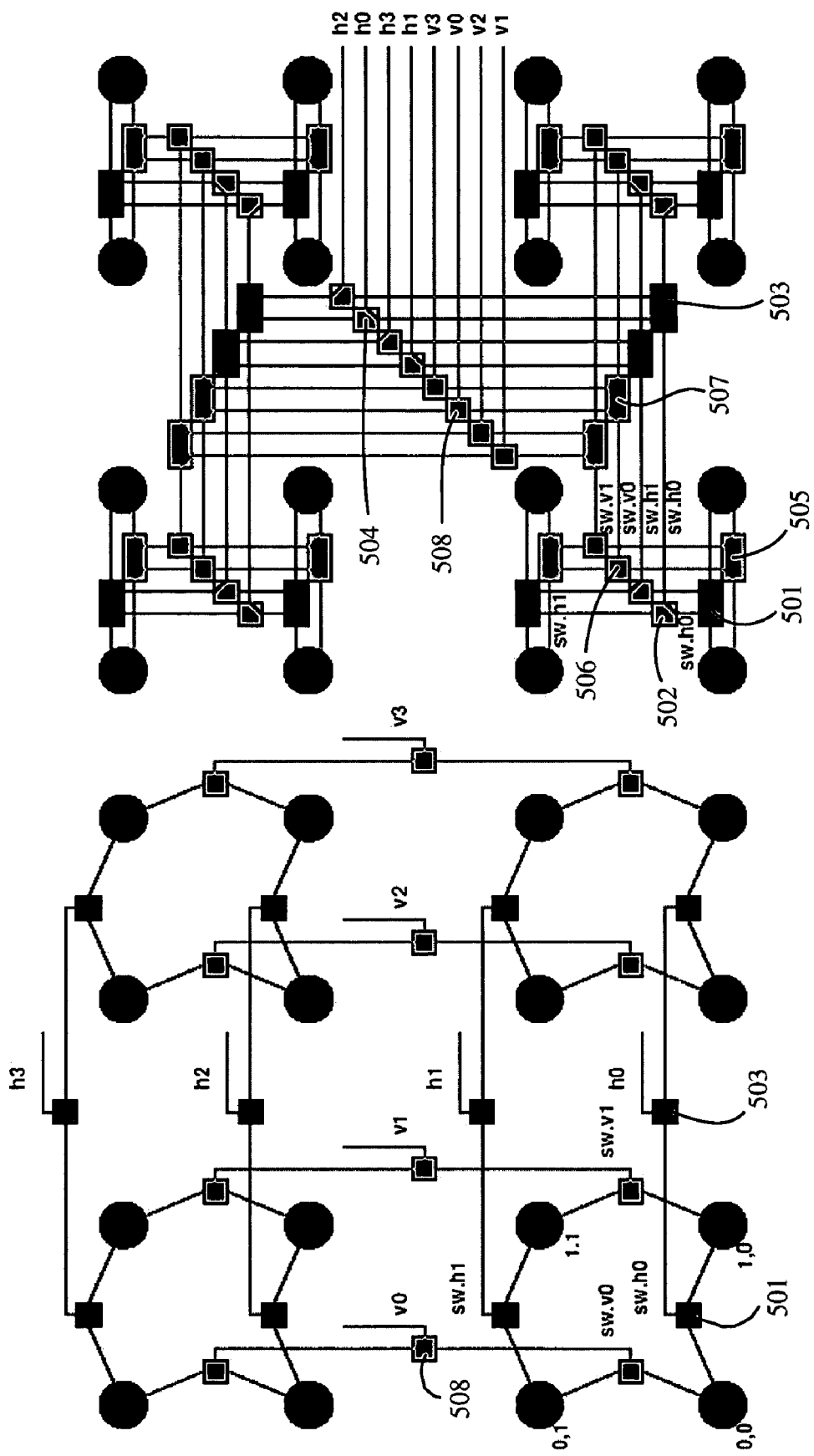
FIG. 17 shows a mapping between a Mesh of Trees network and a HSRA network.

Each horizontal MoT tree may be embedded inside a single HSRA tree. See, for example, FIG. 17, which illustrates a mapping between a p=0.5 MoT according to an embodiment of the present invention and a p=0.5 HSRA (i.e., a BFT). Note that the horizontal tree connecting the lowest row of the MoT (trace (0,0)→sw.h0→h.0) is mapped to a corresponding HSRA tree (marked with same labels). Corresponding switches 501-508 are marked to show the correspondence between the two networks. Switches 501 and 503 perform the same roles in both trees. HSRA switches 502 and 504 are set into a fixed configuration as shown so that switches 501 and 503 (and corresponding switches higher in the tree) are connected together to match the MoT topology.

Similarly, each vertical MoT tree may be embedded inside a single HSRA tree. In this case, switches 505 and 507 in the HSRA link up switches 506 and 506 in the HSRA so they can serve as switches 506 and 508 in the MoT.

In both cases, switches in alternate tree stages in the HSRA are simply switched into a static position (e.g. 502, 504, 505, and 507 in the called out example) to match the topology of the MoT, while the other tree switches directly provide the switching needed by the MoT (e.g. 501, 503, 506, and 508). The MoT and the HSRA both support arbitrary c values using multiple, disjoint trees-disjoint except at the leaf where they connect to the leaves. Since 2 HSRA trees are used to support each MoT tree, it can be seen that every (2c,p) HSRA contains within it a (c,p) MoT. Assuming the same arity (e.g., number of children links per switchbox as described above), a MoT route will traverse twice as many switches when implemented on the HSRA.

The number of base trees (c) required for a BFT/HSRA should never be more than a constant factor larger than that for a MoT. The factor of two in leaf channels will manifest themselves as a factor of two in both the horizontal and vertical width of the HSRA, or a factor of 4 total area due to channel width. Both designs require a number of switches which is linear in the number of endpoints nodes and c. This shows that the c's will be linearly related so the total switches will be within a constant factor of each other.

The factor of two is an upper bound. The mapped route does not fully use the switches in the HSRA (e.g. 502, 504, 505, 507), rather it takes a route which exists in the MoT based on less switching options. As a result, it is likely that any given design will route with a smaller constant factor on the HSRA ($C_{hsra} < 2c_{mot}$). This shows that if one were to come up with a particularly clever or fast way to route a MoT, there would be a direct way to use it for a BFT/H5RA.

For the mapping to work directly, the HSRA preferably allows connections between trees in each leaf similar to MoT corner turns. A typical MoT network connection will route through both a horizontal and vertical tree, changing between a horizontal and vertical tree (a corner turn) at a common leaf node. Consequently a MoT route mapped to an HSRA will need to be able to exit one tree route at a leaf, switch to a different tree, and continue routing in that tree.

For the simplest HSRAs and MoTs, arity-2 trees are used, and a given p may be approximated by deciding whether each tree stage has single or multiple parents (e.g. in the HSRA shown in FIG. 3, the lowest level tree switches have two parents, while the switches one level up have a single parent). In the single tree HSRA, for arity-2 the base sequences of growths ($g_i$'s) are repeated:

$$N^p = (2^k)^p = 2^{kp} = g_0 \times g_1 \times g_2 \times \ldots g_k$$

So, for p=0.5, the sequence (2 1)* is used, while for p=0.75, the sequence (2 2 2 1)* is used. For the MoT, there are separate trees in every channel contributing to the total bisection bandwidth, and each growth spans both dimensions, providing:

$$N^p = ((2^k)^2)^p = 2^{2kp} = 2^k \times g_0 \times g_1 \times g_2 \times \ldots g_k$$

The sequence 1* realized p=0.5 and the sequence (2 1)* realized p=0.75. Redistributing the 2's provides:

$$2^{2kp} = 2 \times g_0 \times 2 \times g_1 \times 2 \times g_2 \times \ldots 2g_k$$

From this, it can be seen that given a MoT growth sequence $g_{mot} = \{g_{mot_0}, g_{mot_1}, \ldots g_{motk}\}$*, HSRA growth sequence can be created as follows:

$$g_{hsra} = \{2, g_{mot_0}, 2, g_{mot_1}, \ldots 2, g_{motk}\}^*$$

That is, the directly corresponding HSRA sequence includes a two before every growth factor in the MoT sequence. This arises because the MoT always effectively doubles its bandwidth in the non-tree dimension simply by aggregating all the tree wires in the orthogonal channels. These are exactly the wires which have fixed switch configurations in the mapping shown in FIG. 17.

One consequence of this is that the directly mapped HSRA growth sequence for a given p corresponds to the HSRA growth sequence derived from the MoT sequence. In many cases this is the same (e.g. for p=0.5: MoT1*→HSRA (2 1)*, for p=0.75: MoT (2 1)*→HSRA (2 2 2 1)*). However, for some sequences, there is a simpler growth sequence which one might use on the HSRA. For example, for p=0.67, the simplest MoT sequence is (2 1 1)*. The corresponding mapped HSRA sequence is (2 2 2 1 2 1)*. However, the sequence (2 2 1)* is a simpler growth sequence often used for the HSRA. If corresponding sequences are not used in the mapping, the embedding may require a larger ratio between $c_{hsra}$ and $c_{mot}$. However, the ratio will remain a constant.

Embedding the MoT in the HSRA makes it clear that the MoT has a subset of the connectivity of the HSRA. However, differences between the MoT and the HSRA should be identified to determine a possible transformation between a MoT network and a HSRA network. More specifically, it should be determined what needs to be added to transform a MoT into a HSRA.

Figure 18:
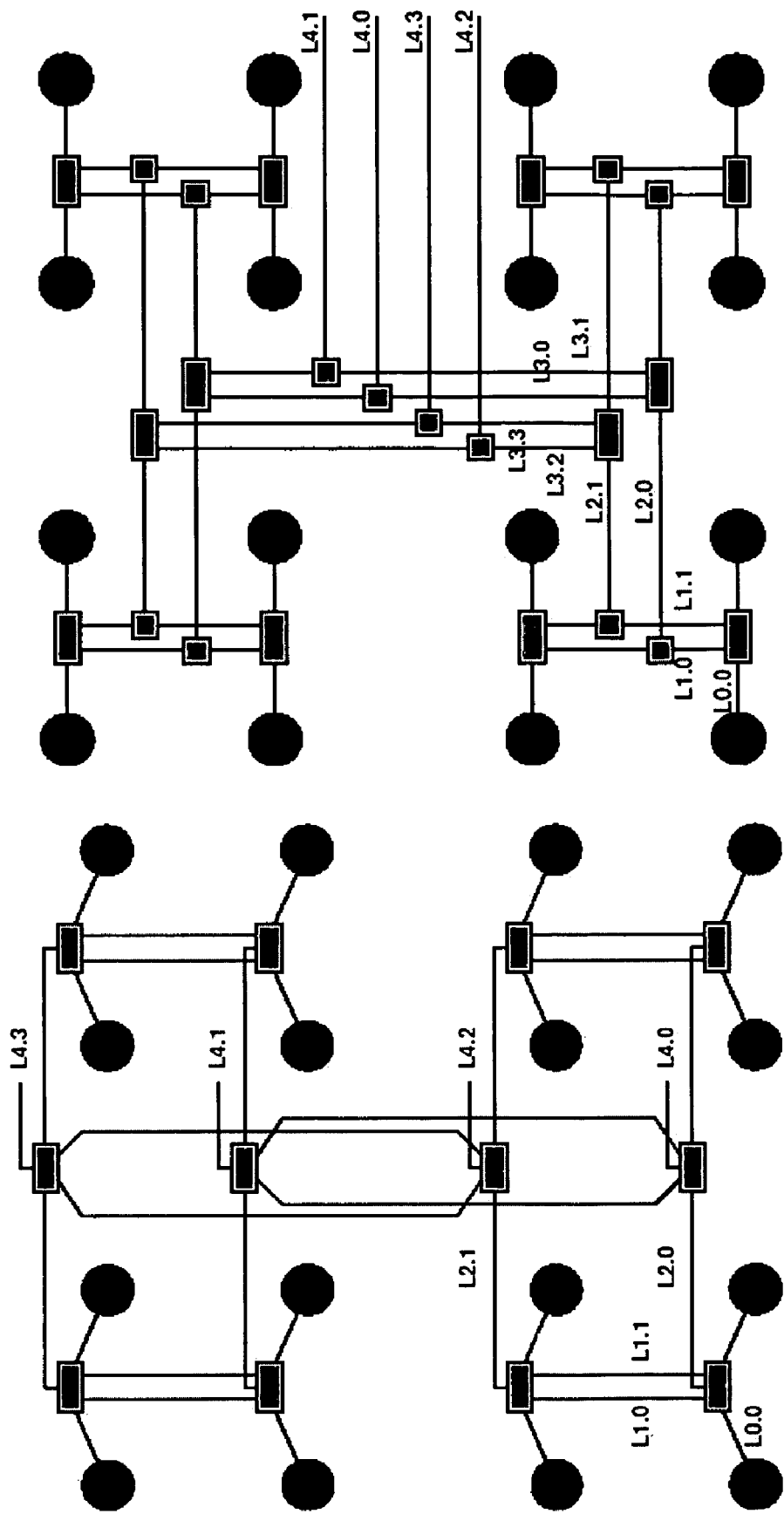
FIG. 18 shows a mapping between a p=0.5 augmented MoT and a p=0.5 HSRA.
Figure 19:
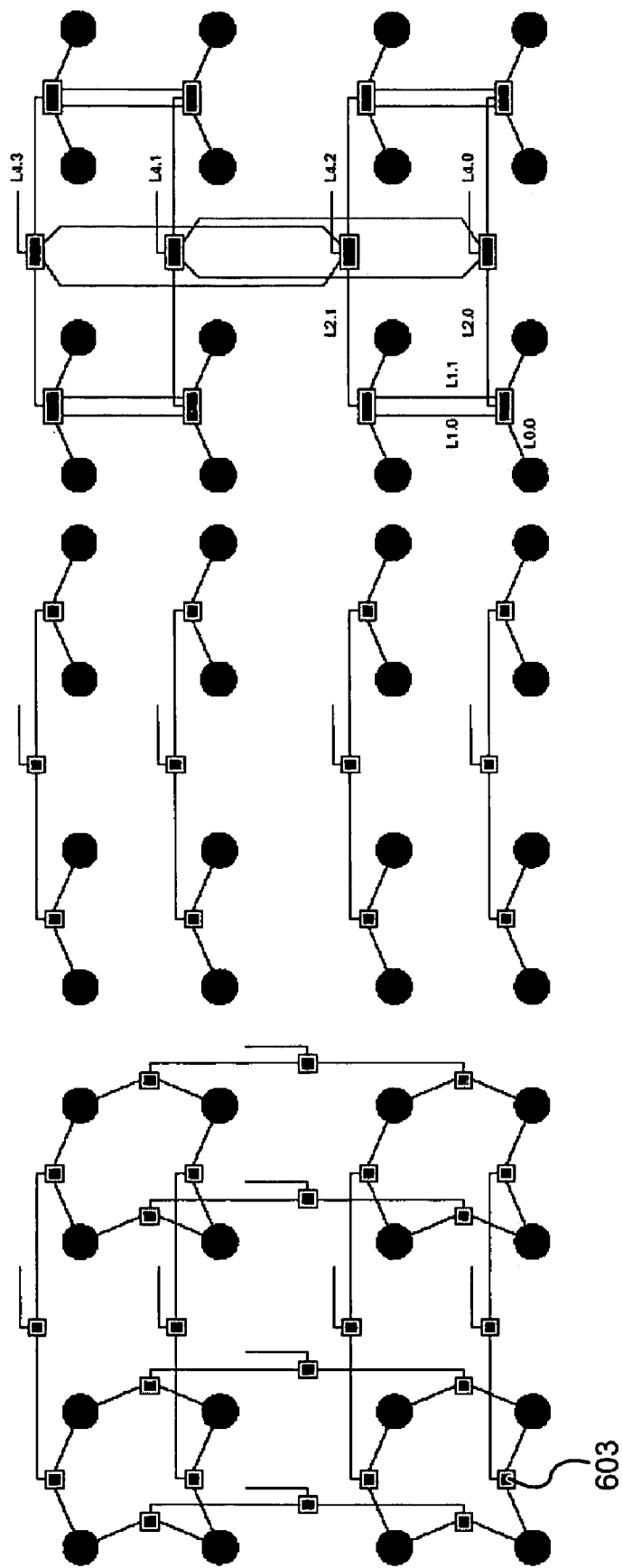
FIG. 19 shows the extraction of horizontal connectivity from a p=0.5 MoT.

FIG. 18 shows a mapping between a p=0.5 augmented MoT and a p=0.5 HSRA. FIG. 18 shows that a strategic set of homogeneous, upper level corner turns may be added to the trees of a single dimension of the MoT in order to achieve HSRA-equivalent connectivity. FIG. 19 shows the MoT the extraction of horizontal connectivity from the p=0.5 MoT by decomposing the MoT into horizontal and vertical channels. Vertical links are added between corresponding switching nodes in different channels. See, for example, FIG. 18. In this case, "corresponding" means that a switching node at level l is connected to the switching node at the same logical tree point (i.e., same logical set of decisions among up links when there is growth) $2^l$ channels above or below it.

Figure 20:
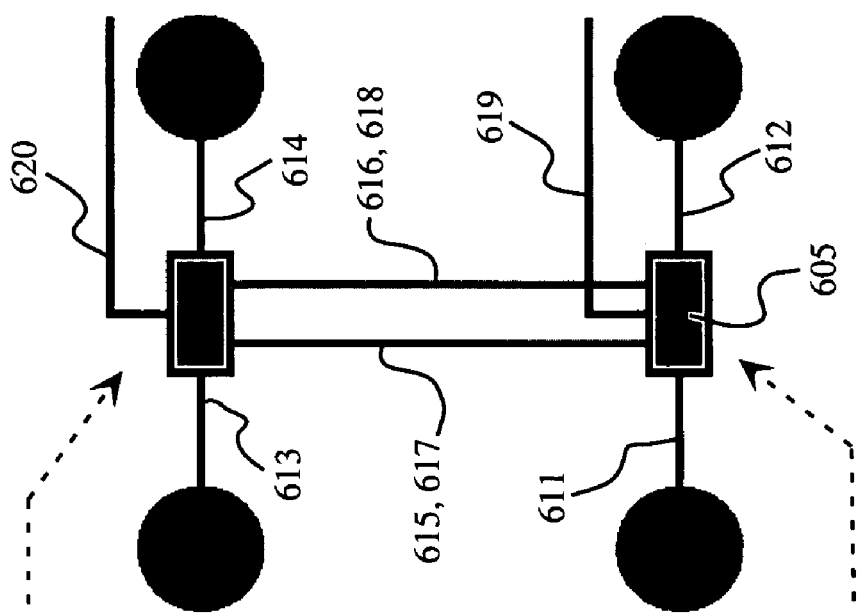
FIG. 20 shows the equivalence of augmented MoT switching and HSRA switching.
Figure 20:
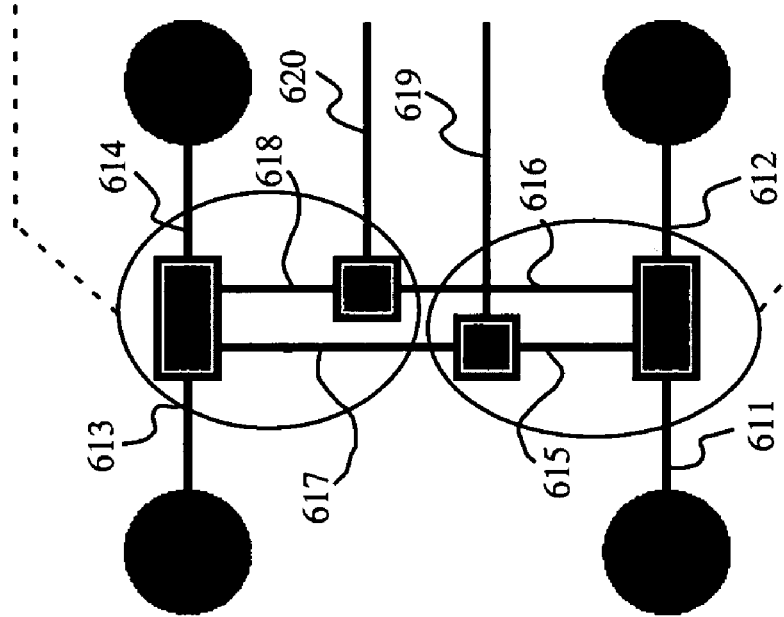

The additional wires turn the single child per side, single parent switching nodes into 5-way switches instead of 3-way switches (for example, a 3-way switch 603 in FIG. 19 turns into a 5-way switches 605, as shown in FIG. 20), and turn the double parent switches into 6-way switches, as described in additional detail below (see, for example switches 56, 757 in FIG. 22 described below). FIG. 20 shows the equivalence between switching in the augmented MoT and the HSRA, with the corresponding wires indicated by the reference numbers 611-620. As shown in FIG. 20, the HSRA switching can be reorganized so that it fits inside these augmented MoT switching units while retaining all of the HSRA connectivity. This switch regrouping added to the vertical link topology recovers HSRA connectivity for any size HSRA. FIG. 18 marks the resulting wire correspondence by the reference characters LX.X (for example, wire L0.0 in the lower left of the MoT shown in the network on the left side of FIG. 18 and wire L0.0 in the lower left of the HSRA shown on the right side of FIG. 18).

In this transformation, every existing switching unit is simply replaced with one which is a constant factor larger. The net effect is to increase the total number of switches by a constant factor. The total number of switches required for this augmented MoT remains linear in the number of endpoints supported.

FIG. 18 show how the MoT implements the HSRA. However, FIG. 18 does not specifically show how the extra wires will be laid out in the MoT. Of importance, is that when the HSRA-augmented connections in the MoT, i.e., the homogeneous, upper level corner turns, are placed, this mapping may affect the maximum channel width and maximum switches per node. The augmented connections can be distributed across the span of a hierarchical MoT segment so that there are a constant number of switches per endpoint and that the number of wires per channel grows at exactly the same rate as the MoT channel wires. Further, by using the existing wire segments in the orthogonal routing channels, no new wires are needed. Although, an additional set of switches should be applied, which allows the use of the existing wires in this manner.

Figure 21:
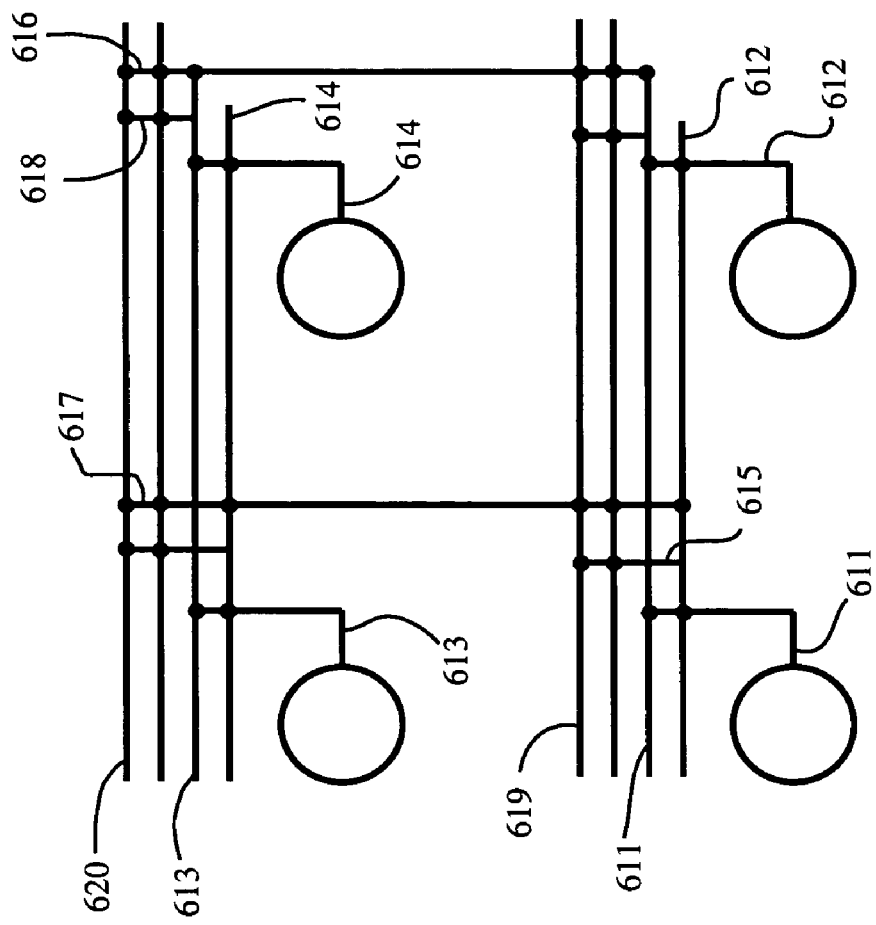
FIG. 21 shows a channel layout view and signal mapping for an augmented MoT.
Figure 21:
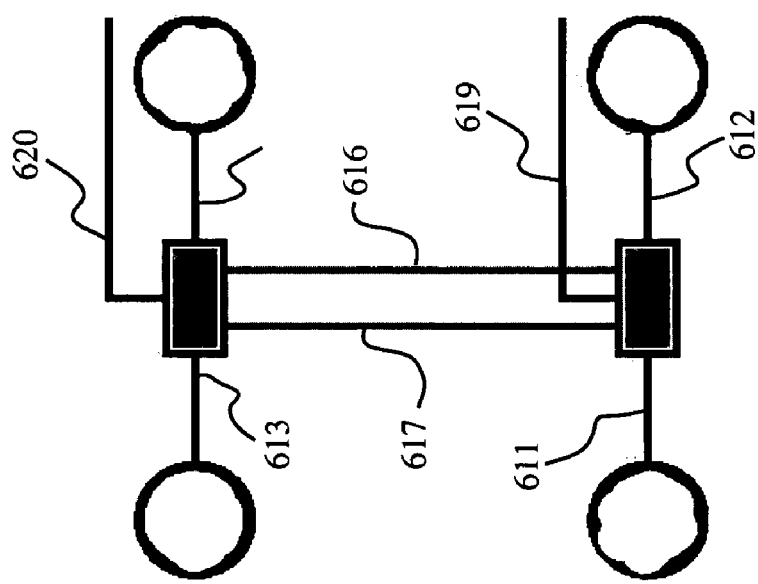

To show switch and wire spreading, it is useful to view a more detailed view of the MoT/HSRA layout which shows channel runs and switches. FIG. 21 shows such a view alongside the logical view for a p=0.5 MoT augmented with these HSRA links. Note here that a pair of MoT wires are used to implement each single wire into the switchboxes in order to get the full connectivity of the HSRA switching. In particular, this allows a full interchange (e.g. 3→2, 4→1), which would not be possible if only a single wire were used. The need for two wires arises because the MoT wire is not segmented and switched at the switchbox, as in the HSRA, but rather is a continuous run. Hence, the switches in the HSRA switchbox are effectively spread out along the length of the pair of wires.

Figure 22:
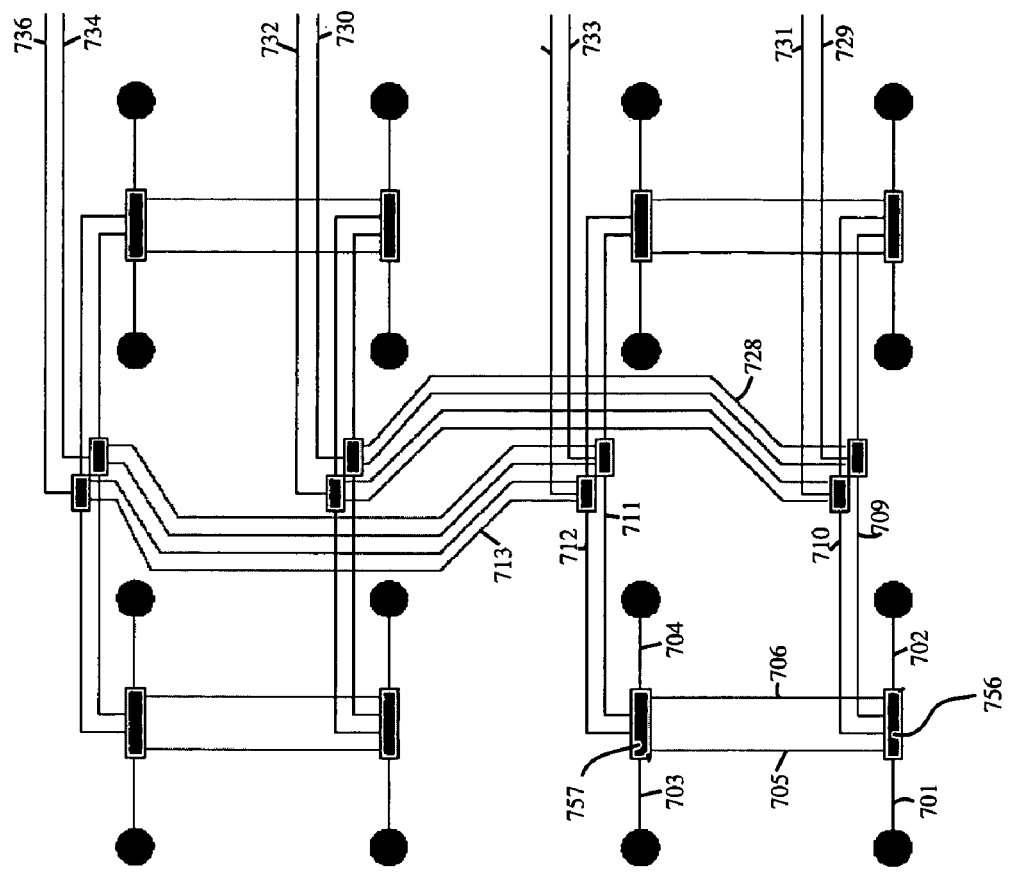
FIG. 22 shows a mapping between a c=1, p=0.75 HSRA and a c=2, p=0.75 augmented MoT.
Figure 22:
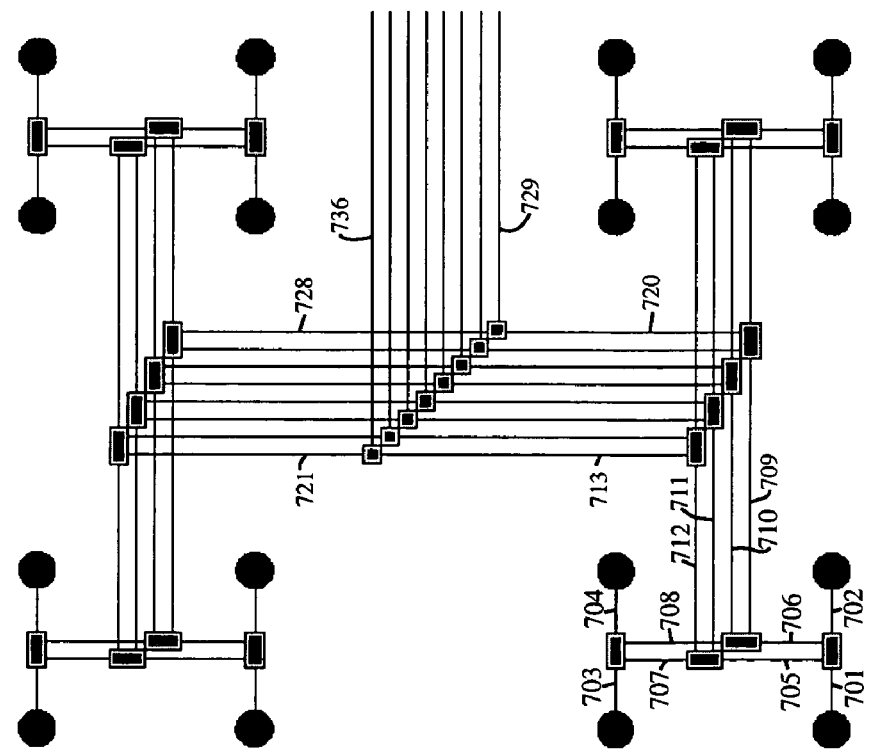

FIG. 22 shows an augmented MoT network for p=0.75 (right hand side) alongside a p=0.75 HSRA (left hand side). FIG. 22 also shows the mapping of wires from the HSRA network to the HSRA network by the reference numbers 701-736. It is further noted that the six way switch 756 in the MoT network contains wire 706 from the HSRA network and the six way switch 757 in the MoT network contains wire 707 from the HSRA network. The p=0.75 case makes clearer that not all the wires can be run directly in the place where they are shown in the equivalence diagram. (See, for example, top right of FIG. 22) without filling the channels unevenly. In fact, there will be $O(N^p)$ such connections at the top of the tree, whereas the MoT layout has already spread out the existing $O(N^p)$ total wires in its bisection among the $\sqrt{N}$ channels such that there are only $O(N^{p-0.5})$ wires per channel. FIG. 22 also shows that these wires can be laid out in constant width per channel given $O(N^{p-0.5})$ wire layers.

Figure 23B:
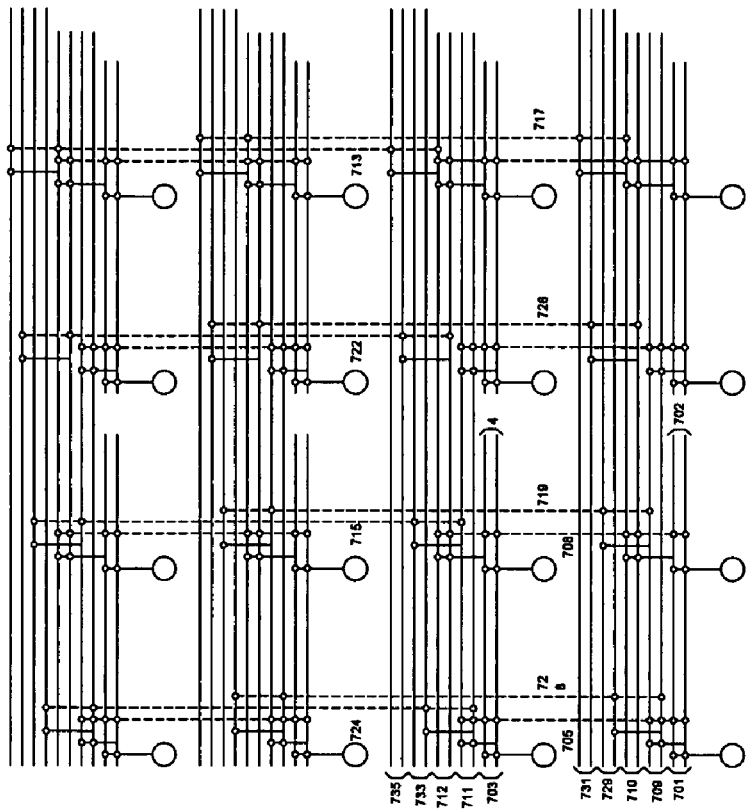
FIG. 23B shows the c=1 HSRA of FIG. 22 from the horizontal dimension of the c=2 augmented MoT.
Figure 23A:
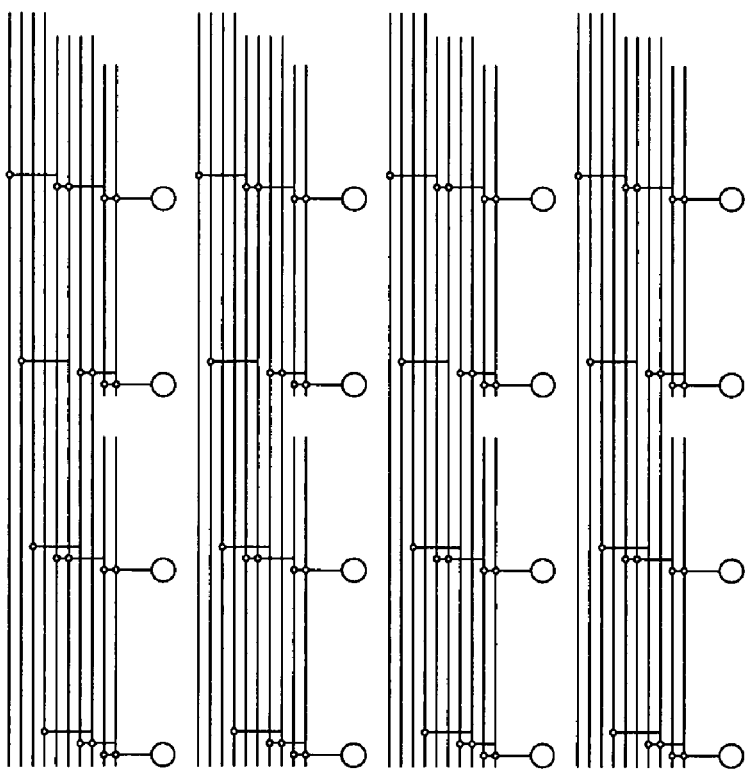
FIG. 23A shows the c=2, p=0.75 augmented MoT of FIG. 22 in the horizontal direction only.

FIGS. 23A and 23B shows a channel layout view for the augmented MoT depicted in FIG. 22. Specifically, FIG. 23A shows a c=2 MoT in the horizontal direction only, while FIG. 23B shows a c=1 HSRA from the horizontal dimension of the c=2 augmented MoT. The c=2 MoT is used to accommodate a c=1 HSRA as suggested above. The 8 wires which had crossed the bisection are now spread out so that there are two wires in each of the four channels. This is accomplished in exactly the same way as described above to provide only O(1) switches at each endpoint. It is preferred that the uplinks are maximally spread out at a given level so that there are not multiple links to the same level at the same endpoint. The geometric reduction in uplinks (wire) per endpoint the tree is ascended makes this easy to accomplish. If the uplinks are spread out properly, the placement of the parent-child uplink switches serve as a guide for the placement of these crosslink connections. That is, every place there is an uplink switch, a companion augmenting link to the associated wire in the companion stage ($2^l$ channels above or below as previously identified) is placed. In this way, the number of switches at each endpoint is roughly doubled. Unlike switches, the wires do overlap. That means the number of wires per channel will grow as longer wires overlap shorter ones. However, the wire growth exactly matches the standard wire channel growth so that the existing wires can be used for these runs.

It is noted that there is a total of $g_0 \times g_1 \times \ldots \times g_k$ uplinks at the root of a height k row or column tree. Hence, $$N_{up}(k) = g_0 \times g_1 \times \ldots \times g_k = 2^{2kp-k} = 2^{2k(p-0.5)}$$

This is the same as the per channel row or column width at level k:

$$W_{mot}(k) = 2^{2k(p-0.5)}$$

These uplinks are distributed across the segment span of length $2^k$, so each node gets:

$$N_{\text{up\_per\_node}}(k) = \frac{N_{up}}{2^k} = \frac{2^{2k(p-0.5)}}{2^k} = 2^{2k(p-1)}.$$

The augmenting wires span length $2^k$. Wire channel width contribution per level then is:

$$W_{mot_{augment}}(k) = 2^k N_{\text{up\_per\_node}} = 2^{2k(p-0.5)}.$$

As indicated, this shows the same wire requirements as the MoT needed for this level.

The total width of either channel is:

$$W_{mot} = \sum_{k=0}^{k=\log(\sqrt{N})} (W_{mot}(k))$$

$$W_{mot} = \sum_{k=0}^{k=\log(\sqrt{N})} (2^{2k(p-0.5)}).$$

Hence, $$W_{mot} = 2^0 + 2^{2(p-0.5)} + 2^{4(p-0.5)} + \ldots + 2^{2\log(\sqrt{N})(p-0.5)}$$
$$= 2^0 + 2^{2(p-0.5)} + 2^{4(p-0.5)} + \ldots + 2^{\log(N)(p-05)}$$
$$= 2^0 + 2^{2(p-0.5)} + 2^{4(p-0.5)} + \ldots + N^{(p-0.5)}$$
$$= N^{(p-0.5)} + \left(\frac{N}{2}\right)^{(p-0.5)} + \left(\frac{N}{2}\right)^{(p-0.5)} + \ldots + 1$$
$$= N^{(p-0.05)}\left(1 + \frac{1}{2^{(p-0.5)}} + \frac{1}{2^{2(p-0.5)}} + \ldots + \frac{1}{N^{(p-0.5)}}\right) <$$

$$N^{(p-0.5)}\left(\frac{1}{1-\left(\frac{1}{2}\right)^{(p-0.5)}}\right)$$

For p>0.5, $(\frac{1}{2})^{(p-0.5)} < 1$, so the sum converges to a p-dependent constant times $N^{p-0.5}$, is within a constant factor of the Manhattan channel width lower bound.

Figure 24B:
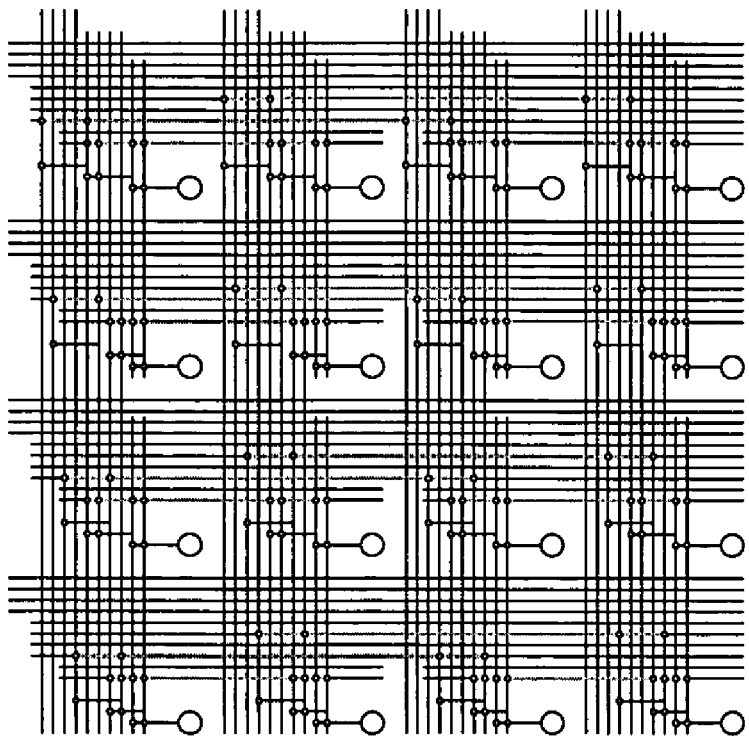
FIG. 24B shows the c=2 augmented MoT wires of the MoT depicted in FIG. 22 in both dimensions with switches and corner turns in the horizontal dimension.

Since the number of wires added for a stage of augmenting links is exactly the same as the number of wires in the parent stage to which they are connecting and since a c=2 MoT is being used, the wires in the corresponding stage of the orthogonal tree can be used to perform this connection simply by adding the switches necessary to allow them to serve as these augmenting links. FIGS. 24 and 24B show the additional switches and shows how the augmented paths run over the orthogonal wire runs.

Figure 24A:
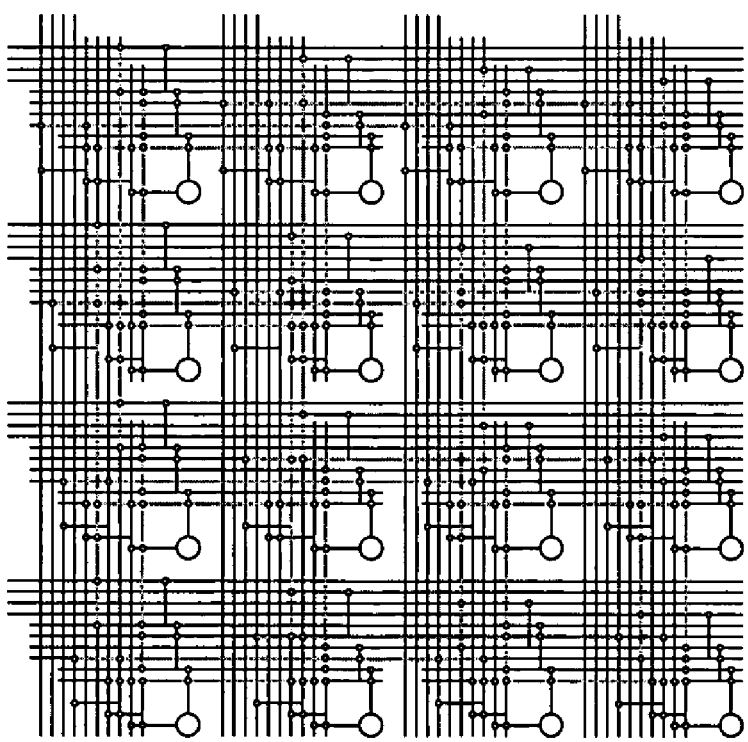
FIG. 24A shows the c=2 augmented MoT wires of the MoT depicted in FIG. 22 in both dimensions with switches and corner turns in both dimensions.
Figure 25:
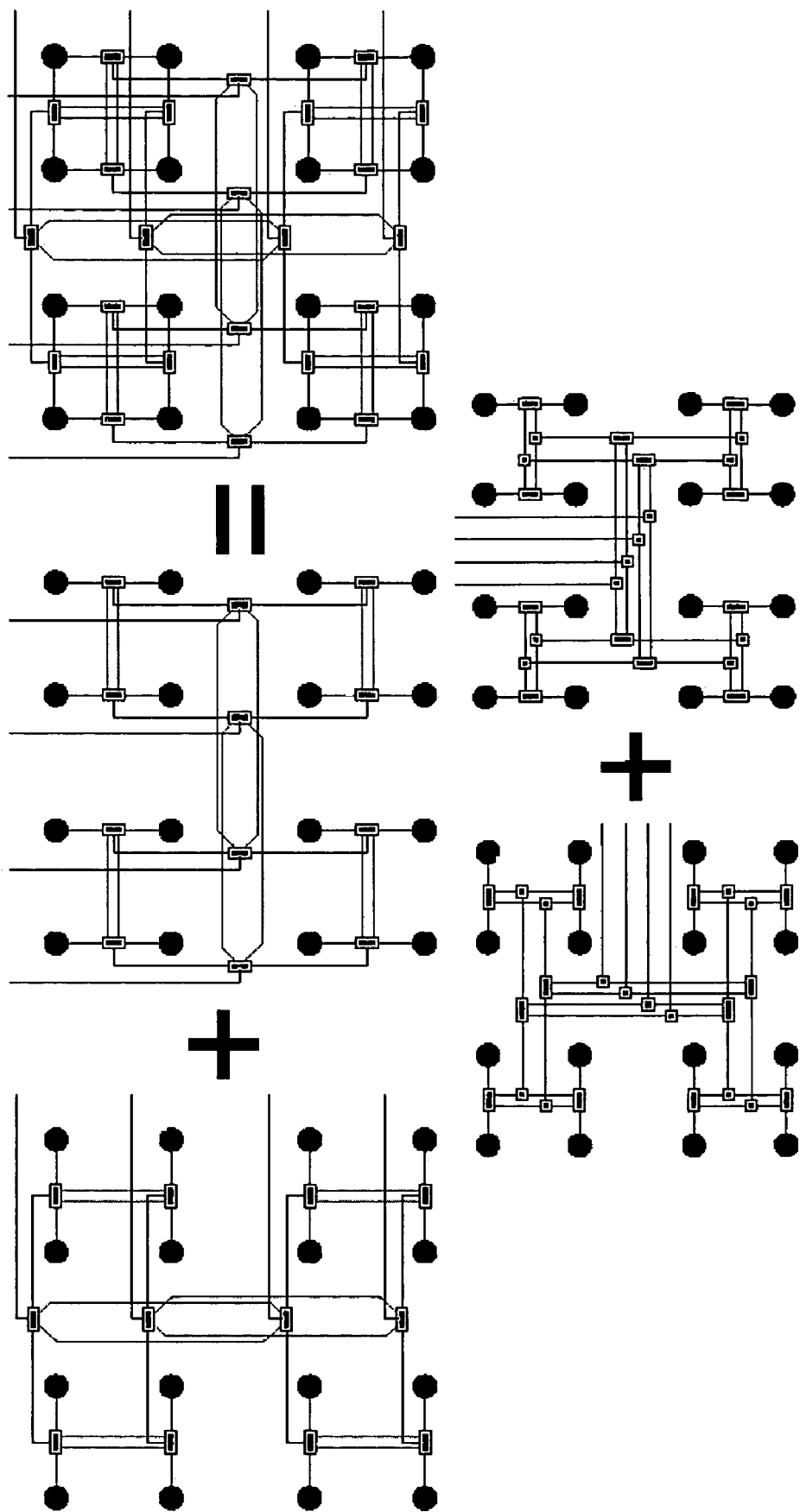
FIG. 25 shows the correspondence between an augmented MoT in both dimensions to two HSRAs rotated 90° relative to each other.

The description above shows how to make one dimension of a $(C_{mot}=2C_{hsra}, p)$ MoT contain a $(C_{hsra}, p)$ HSRA. The augmenting link switches can be populated in both dimensions as shown in FIG. 24A. This makes a c=4 MoT contain c=1 HSRA composed with its transpose. FIG. 25 shows that a c=4, p=0.5 augmented MoT in both dimensions corresponds to composing two c=1, p=0.5 HSRAs rotated 90° relative to each other. That is, an HSRA network plus a transpose of the HSRA network is the same as a MoT network with homogeneous, upper-level corner turns.

The augmentation that turns a MoT network into a BFT/HSRA networks assists one to understand the difference between these two networks. The BFT/HSRA can bee seen as a particular corner turn scheme applied to the MoT, thus allowing these two networks to be unified into a single, parameterized design. Similarly, the BFT/HSRA wiring gives one insight into how to formulate a limited corner turn scheme, one that does not asymptotically increase the switches or wires in the MoT, but does provide interesting switching characteristics. Since the BFT/HSRA only has to route up and down a single tree, whereas the MoT without augmentation generally has to route up and down two trees, the augmented MoT has half the switches in the worst-case paths between a source and a destination.

Understanding the equivalence in FIG. 25 makes it clear that the arity-2 HSRA directionality bias can be removed by overlaying the network with its transpose. Since cases where MoT and HSRA networks may be used FPGAs have c>1, there should always be multiple trees, which allows for the alteration of the orientation of the trees relative to each other. This equivalence also makes it clearer that the MoT staggering may also be applied to the BFT/HSRA. This mapping also shows us how any results on fast HSRA mapping may also be applied to a MoT network.

From the equations discussed above, it can be seen that the p>0.5 MoT, the p>0.5 augmented MoT (or the HSRA), and the mesh have the same asymptotic channel width. The equivalence transformation described above allows one skilled in the art to apply the knowledge about MoT layouts to HSRA layouts. Significantly, the construction described above showed that the HSRA can be laid out in asymptotically the same channel width as the MoT. In A. DeHon, "Compact, Multilayer Layout for Butterfly Fat-Tree," *Proceedings of the Twelfth ACM Symposium on Parallel Algorithms and Architectures* (SPAA '2000), ACM, July 2000, pp. 206-215, it is shown that a p=0.5 BFT/HSRA could be laid out in linear area given O(log(N)) wire layers; but at that point in time the general question of laying out a BFT/HSRA (1.0>p>0.5) in linear area using multilayer metalization remained open. The equivalence described above also allows the exploitation of the construction that showed how to layout the MoT for any p>0.5 in linear space using $O(N^{p-0.5})$ wire layers in order to also layout any HSRA in linear two-dimensional area using $O(N^{p-0.5})$ wire layers.

As described above, the embodiments according to the present invention using a MoT network are compared to a conventional, Manhattan Mesh. As indicated, the most fundamental difference between the Manhattan Mesh and the MoT is the flat endpoint connectivity on the Mesh. That is, the Mesh C-box connects the compute element's inputs or outputs to all of (a constant fraction of) the wires in the channel, whereas the MoT only connects to the base level tree channels and uses the tree connections to climb up the tree to reach longer segments. This has the immediate impact that the MoT needs only a linear number of switches, while the Mesh needs O(W) switches per endpoint. Since it has been established that W grows with N for p>0.5, it is again noted the mesh requires asymptotically more switches than the MoT.

This difference and the other traditional differences between the MoT and the Mesh can be parameterized in order to define a continuum space between the extremes. As noted above, a Manhattan mesh can be viewed as a special, degenerate case of the MoT where several of the parameters are tuned to their extreme values. These parameters may include flatness, segment distribution, arity, staggering, shortcuts, corner turns, and switchbox population and domains.

Figure 26:
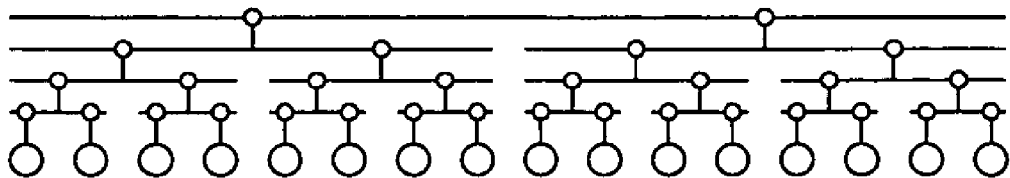
FIG. 26 shows different degrees of flattening on a single row (column) channel in a p=0.5 MoT.
Figure 26:
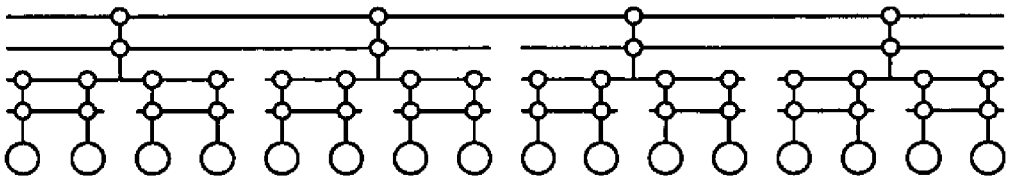
Figure 26:
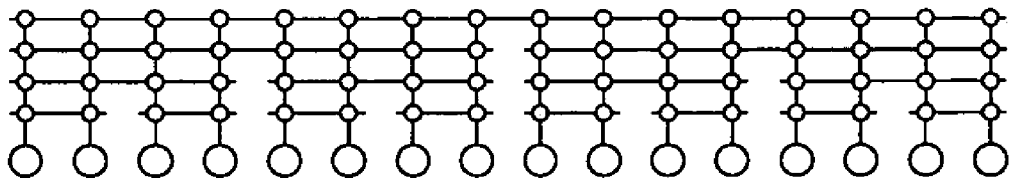

Flatness can be parameterized in terms of the number of parent tree levels to which each child node is connected. In a MoT network, a child at level k is connected to a parent at level k+1. In the Mesh, the leaf child at level 0 is connected to all levels above it. In general, direct connections among a group of f levels may be provided; that is, a child at level nf is connected to levels nf+1, nf+2, . . . nf+f FIG. 26 shows different degrees of flattening on a single row (column) channel in a p=0.5 MoT.

Rent's Rule can be applied strictly to define a set of segment distributions. From the MoT designs described above, there are a c length 1 segment, $c \times g_{mot_0}$; length 2 segments, $c \times g_{mot_0} \times g_{mot_1}$; length 4 segments, and son on. As discussed above, growth rates are chosen to correspond to the target p value. This same idea could be applied to the selection of mesh segment lengths and segment length distributions. As noted above, if these lengths are chosen geometrically in this manner, and if corner turns are only allowed at segment ends, the mesh only needs a total number of S-box switches which is linear in the number of nodes supported by the design.

Conventional mesh designs have often chosen to truncate their hierarchy-stopping after a given segment length or jumping from one segment length to full row/column length lines rather than including all of the geometric wire lengths.

Binary trees for the MoT and HSRA have been described and shown. However, as discussed above, trees with any number of children levels to a parent level can be built. For example, FIGS. 12A-12D show trees with different arities. The arity tunes the rate of segment growth. So an arity-4 MoT has segments of length 1, 4, 16 . . . rather than 1,2,4,8, 16 . . . . In this way the combination of arity and p defines segment distribution.

Figure 27:
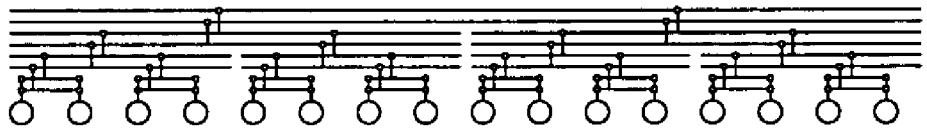
FIG. 27 depicts staggering a single row (column) channel in a p=0.5 MoT.
Figure 27:
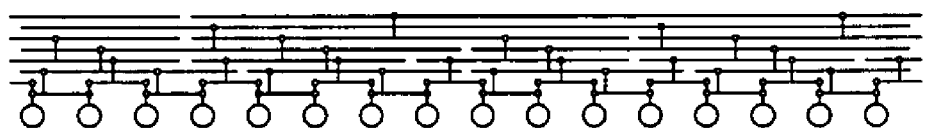

As discussed above, when there is more than one segment of length longer than one, it is useful, both for switch placement and for routing, to spread out the switch placements In embodiments according to the present invention utilizing a MoT, the alignment of the trees is staggered relative to each other. See, for example, FIG. 27, which shows a staggered MoT compares to a MoT in which no staggering is used. As described above, staggering minimizes the cases where a route must use a significantly longer (higher) link than it should take to span the distance between the source and sink.

In the strict tree structure of the MoT and BFT/HSRA, there are cases where two nodes are physically close in the layout but logically distant in the tree. This effect is mitigated by staggering. As described above, it can be eliminated entirely by adding shortcut connections which allow segments at the same level and in the same channel to be connected to their immediately adjacent neighbors. These shortcuts, which only requires a constant factor more switches than the base MoT, help assure that the physical distance one must travel in the MoT or BFT/HSRA is never more than a constant factor larger than the Manhattan distance. These shortcuts perform exactly the same switching as the end-to-end segment switching (E⇌W, N⇌S) which appears in the switchpoints of standard, Manhattan, switchbox designs. That is, in the standard diamond switchbox, the switch which connects a segment to a single segment of the same length in the same channel on the other side of the switchbox, is essentially the same as the shortcut switches which may or may not be included in a MoT design according to an embodiment of the present invention.

Corner turn parameterization defines where and how routes may turn between orthogonal channels (from horizontal to vertical routing or vice-versa). As described above, in a standard Manhattan mesh switchbox, a segment has a corner turning switch to a single orthogonal segment when it crosses that segment or to one segment in each direction when it arrives at a switchbox coincident with a segment break in its corresponding segment. In a standard diamond switch configuration, these are the NW, NE, SW, and SE switches. These corner turns make up the remaining 1-2 switches which are normally attached to the end of each segment in a Manhattan mesh.

As long as there is one corner turn per segment per switchbox, the number of switches per switchbox is growing, so the total number of switches in the switchbox grows faster than linearly. It is asymptotically desirable to avoid this level of corner turn population. Since MoT and BFT/HSRA designs can be laid out using asymptotically similar wiring requirements but without such extreme corner turn population suggests there is a viable alternative and it will be beneficial to exploit it. In the MoT, one consideration may be whether the corner turns should be limited to the leaves or whether some, limited scheme for higher level corner turns should be used. In general, the corner turn variations make up a rich parameterized space for design.

Figure 30C:
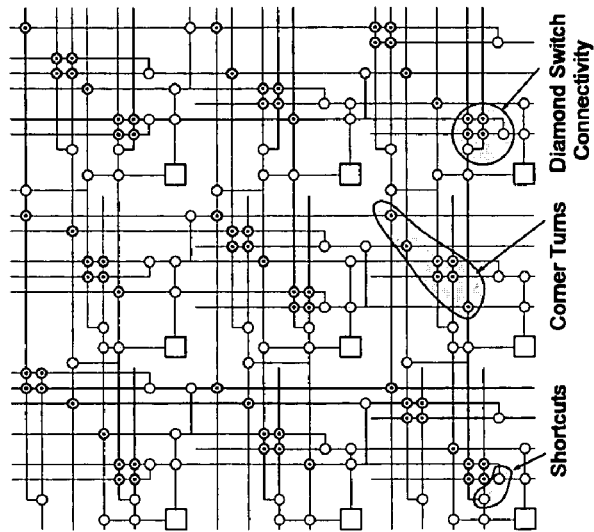
FIG. 30C shows an alternate embodiment according to the present invention that overlaps adjacent segments in the same channel.
Figure 30B:
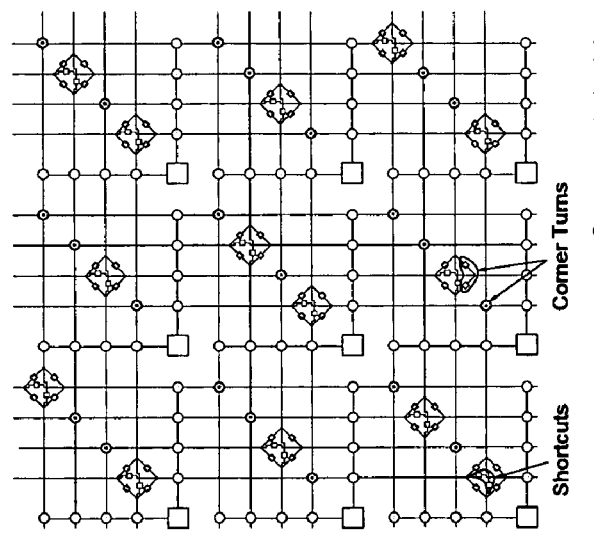
FIG. 30B shows a mesh layout having both corner turns and shortcuts.
Figure 30A:
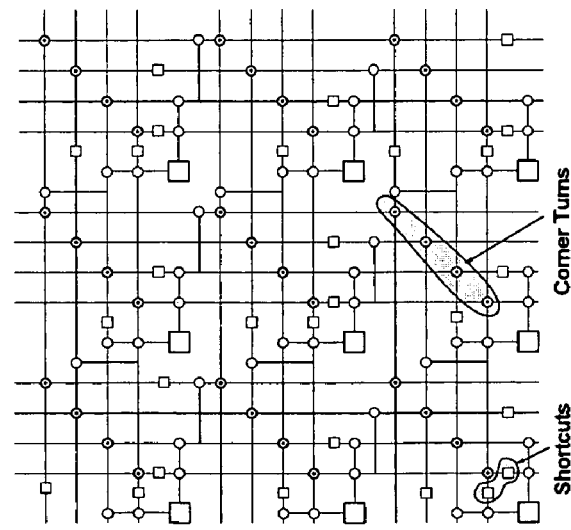
FIG. 30A shows an embodiment of the present invention in which a single corner turn at each switchbox is used.

In one embodiment according to the present invention, only a single corner turn at each switchbox is used. This embodiment is shown in FIG. 30A. FIG. 30B shows a mesh layout having both corner turns and shortcuts. FIG. 30C shows an alternate layout that overlaps adjacent segments in the same channel so that simple switches can bed used between orthogonal lines to support corner turns and allow this inclusion of the pair of corner turns (e.g both NE and NW from the north input to a switchbox) typical in mesh switch populations.

The general issues which the mesh considers in terms of switchbox population can be decomposed into shortcut and corner turn issues discussed above. In the preceding, Manhattan mesh and MoT designs are described where there are a constant number of wires connecting the end (or internal points in the Mesh case) of segments. However, fuller switchbox population designs may also be used. The traditional Mesh design has disjoint domains which are only connected at the leaves. Similarly, the MoTs designs discussed above generally only allow turns between separate row and column trees at the leaves and typically can only change among corresponding row and column trees at a corner turn. However, MoT designs according to embodiments of the present invention are not limited to this topology.

Unifying the design space provides insight into how designs can be tuned. Reconciling the Manhattan mesh with the MoT introduces new design parameters to explore for tuning the Manhattan mesh and the MoT. It also sheds some light on some of the assumptions made in these designs.

It is noted that the empirical results with MoT designs suggests that shortcut connections may offer marginal additional value over staggering. Shortcuts do reduce the total channel width required to route before staggering, but only at a net increase in the total number of switches. Once staggering is added, there is marginal benefit even to wire reduction.

As shown above, a BFT/HSRA can be laid out with asymptotically the same channel width as a Manhattan mesh. The same layout strategy may be used for a ToM. This can be thought of as a generalization of Leiserson and Greenberg's Fold-and-Squash layout as described in R. I. Greenberg and C. E. Leiserson, "A compact layout for the three dimensional tree of meshes," *Applied Math Letters*, vol. 1, no. 2, pp. 171-176, 1988. The channel asymptote will still hold for the ToM, but the fully populated ToM does not have the favorable, linear switch asymptote of the HSRA or BFT. The pure ToM, without shortcuts, can accommodate layouts simply by recursive bisection. As long as the bisection cuts do not exceed the tree bandwidths, the recursive bisection design will be routable on the ToM.

Put together, these observations imply that the a posteri global route Rent exponent for a Manhattan layout should be the same as the a prior Rent exponent. That is, while there may be difference in the layout-based partitions, these should, at most, be placement shuffles to reduce the constant factors associated with tree overlap among tree levels and will not change the asymptotic growth rate. The MoT and ToM layout described above instruct one how to take any Rent characterized (c, p) design and lay it out with $O(cN^{p-0.5})$ Manhattan channel width. This provides an upper bound on the global channel width required to route a (c, p) design on a mesh; this upper bound is within a constant factor of the lower bound derived on mesh channel width. Note that the $c_{mot}=2c_{hsra}$ construction described above already more than accounts for the downlink conflicts that forced the use of a (1.5c, p) ToM to accommodate a (c, p) design, so the channel width is no higher than 2c times the per channel width of the MoT derived above:

$$W \leq 2cN^{(p-0.5)}\left(\frac{1}{1-\left(\frac{1}{2}\right)^{(p-0.5)}}\right) \leq \left(\frac{2^{(p+0.5)}}{2^{(p-0.5)}-1}\right)cN^{(p-0.5)}$$

This suggests there is no fundamental reason for the post placement Rent exponent for a design to be larger than the pre-placement Rent. However, while asymptotically tight, the bounds are loose in absolute terms; for example, the ratio between the lower bound described above and the upper bound presented immediately is around 30 for p=⅔. Consequently, this leaves room for large constant factor differences between pre placement and post-placement IO ratios, and it may take very large designs for the asymptotic effects to dominate.

To build efficient switching networks for typical circuits, it is preferred that networks are used that allow the exploitation of the locality structure which exists in these networks. Manhattan meshes, Mesh-of-Trees, and Tree-of-Meshes style networks are all examples of limited-bisection switching networks, which support this locality exploitation. While these networks are different in formulation, it has been shown above that the networks have the same asymptotic wiring requirements-all requiring $O(N^{p-0.5})$ wires per channel in 2D layouts when p>0.5. Equivalence mappings have been demonstrated between the networks (MoT embedded in HSRA, HSRA embedded in augmented MoT with corner turns, and MoT embedded in 2D-mesh). According to embodiments of the present invention, these mappings require at most a constant scale factor in wires. The MoT to ToM and ToM to MoT embeddings are made with only a constant scale factor in switches.

Based on these mappings, it can be seen how to layout linear-population ToM designs of any p (e.g. BFT, HSRA) in constant area using multilayer metalization and how to produce constructive global mesh routes which are known to be within a constant factor of optimal. These networks can be seen as parameterizations within a larger, unifying design space. Identification of this design space assists in the understanding the tradeoffs which each network makes within the design space and aides the navigation of the design space to meet network design goals.

For example. according to embodiments of the present invention, any circuit can be laid out in a linear two-dimensional area. This may be done by a) recursively partitioning the circuit using efficient bi-partitioners/separators; b) assigning nodes to a HSRA or MoT topology with hierarchical-upper-level corner turns; c) routing wires along network paths in a MoT topology; and d) using the MoT layout according to embodiments of the present invention to determine the routing of each wire.

Figure 2:
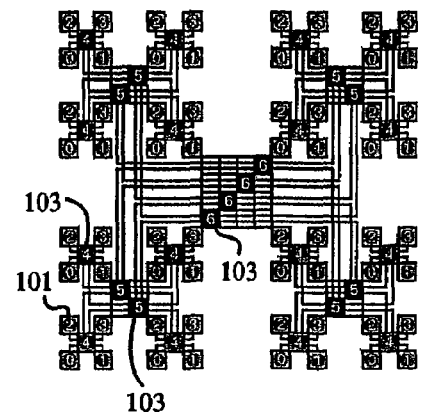
FIG. 2 (prior art) illustrates a Butterfly Fat Tree network.

The recursive partition may be performed by cutting the circuit in half so as to minimize the number of edges between the two halves. Such partitioning is well-known in the art. Then for each partition that has a size larger than one, continue to perform the partitioning until the size of one is achieved. The resulting sequence of partitions defines a tree for the nodes. That is, if a node is in partition 0 in the first partition, it is under the 0 child of the root, if a node is in partition 1 in the first partition in 1 child; the next partition refines whether the node is under the 0 or 1 child of that node. Hence, the partitioning can strictly define the placement for a node and the nodes can be assigned to physical processing elements. For example, in a diagram such as that presented in FIGS. 1-3 and starting from the root, 0 can be assigned to the left and 1 to the right (or vice versa), and the path from the root to the node in the recursive-bisection partition tree defines the path from the root to the target processing element in the physical network of processing elements. Placing all nodes like this guarantees one node per processing element.

Further, if the ToM/BFT/HSRA has adequate bandwidth at each tree level (has a suitable c,p parameterization to meet or exceed the requirements of the recursive bisection), then there will be enough wires to route the graph.

When the c,p parameterization is selectable for the physical network, then a suitable parameterization can be selected to accommodate the graph. In some embodiments, the physical network will be built prior to seeing the graph and there may be a need to map a design with a large c,p onto a network with smaller parameters. In these cases, the design will need to be spread. See, for example, Andre Dehon, "Balancing Interconnect and Computation in a Reconfigurable Array (or, why you don't really want 100% LUT utilization)," Proceedings of the 1999 ACM/SIGDA Seventh International Symposium on Field Programmable Gate Arrays (FPGA '99, Feb. 21-23, 1999). In fact, sometimes, even if the c,p parameterization for the physical networks is selected, it may be desirable to select a smaller c,p parameterization than what a simple recursive bisection would imply and perform some spreading, It is known how to map nodes in an arbitrary graph to a ToM/BFT/HSRA. Using fast recursive bisection techniques (e.g. see George Karypis, "METIS:Family of Multilevel Partitioning Algorithms," described at http://www-users.cs.umn.edu/~karypis/metis/index.html), it is well known how to do this quickly. However, embodiments according to the present invention show how to layout an arbitrary BFT/HSRA in O(N) 2D area for p>0.5. This procedure is described above and FIGS. 18-24 illustrate the technique.

Therefore, according to embodiments of the present invention, show how to: a) layout an arbitrary graph in O(N) 2D area; and b) provide an efficient [O(N) 2D area] BFT/HSRA implementation and use prior techniques to map an arbitrary graph to the BFT. The routing in this MoT-embedded BFT/HSRA need be no harder than routing the BFT/HSRA, since all the switch connectivity of the original BFT/HSRA is preserved in the embedding discussed above.

Consequently, embodiments according to the present invention provide a fast-mapping computer-aided design flow for laying out a circuit by: 1) using a fast bipartitioner (KLFM, see, e.g., Brian Kernighan and S. Lin, "An Efficient Heuristic Procedure for Partitioning Graphs," Bell Systems Technical Journal, v. 49, n. 2, pp. 291-307, February 1970, and C.M. Fiduccia and R. M. Mattheyses, "A Linear Time Heuristic for Improving Network Partitions," Proceedings of the 19$^{th}$ Design Automation Conference, pp. 175-181, 1982, and METIS) to recursively partition design; 2) assigning the bipartition hierarchy to a HSRA/BFT design; 3) routing the HSRA/BFT by using, for example, greedy routing, a spatial router, or an online expander routing strategy, described below; 4) using the mapping of HSRA/BFT wires the HSRA layout as described above or using MoT augmented with homogeneous upper-level corner turns as described above.

The greedy routing that may be used comprises: a) picking an unrouted source/sink pair; b) performing a graph search to find a free path through the network from the source to the sink; c) allocating the path by marking all the resources needed for the link as used; and d) repeating step a as long as there are unrouted source/sink pairs.

Techniques for spatial routing is described by Randy, Huang, John Wawrzynek, "Stochastic, Spatial Routing for Hypergraphs, Trees and Meshes," *Proceedings of the International Symposium on Field-Programmable Arrays*, FPGA 2003, Feb. 23-25, 2003, pp. 78-87. Techniques for using an online expander routing strategy are described by Sanjeev Arora, Tom Leighton and Bruce Maggs, "Online Algorithms for Path Selection in Nonblocking Network," *SIAM Journal on Computing*, vol. 25, no. 3, June 1996, pp. 600-625. Spatial routing is also described in additional detail in U.S. application Ser. No. 10/356,710, filed Jan. 31, 2003, which is incorporated herein by reference.

Returning to the discussion above regarding adding switches allocated to each processing element beyond the minimum required to provide the necessary routing, it is noted that the additional switches can be added at each processing element in accordance with embodiments of the present invention as long as the number added is kept to a constant. This provides that the efficient layout provided by embodiments of the present invention will be maintained. Using a constant number of switches at each identified uplink position provides that there will be a constant number of switches per processing element.

It is note that in some embodiments according to the present invention, the shortcuts and corner turns used in these embodiments may be considered a very coarse-grain (binary) addition. That is, going from no corner turns to corner turns is a multiple in the constant factor and going from no shortcuts to shortcuts is another multiple in the constant factor. So the benefit derived from adding the shortcut and corner turn features is somewhat mixed due to the increase in the constant factor. Other embodiments according to the present invention have a more discrete way to add the desired shortcuts and corner turns between the extremes of no shortcuts and corner turns and fully populated shortcuts and corner turns.

According to other embodiments according to the present invention only a fraction of the potential shortcut sites are populated, but the populated shortcut sites are selected in a manner that maintains the balance in the number of switches associated with each processing element. Alternatively, or in addition, only a fraction of the potential corner turns are populated. Another alternative is give some or all of the links more up connections than the simplest version. For example, in stages with a single parent, these other embodiments would provide connections to two or more parents. In stages with two parents, these other embodiments may provide connections with three or more parents. However, it still must be determined which shortcuts and corner turns are to be populated and where the connections to the additional parents should be made.

In accordance with these other embodiments according to the present invention, this determination is made by first starting with a base parameterization and switch placement in accordance with those embodiments discussed above. Then the additional switches may be added randomly. However, the random addition of switches may be accomplished in various manners.

For example, in one embodiment, a fixed number of shortcut, corner turn, and uplink switches would be allocated for each processing element. Then all possible shortcuts that could be associated with a processing element are identified according to the uplink associations from the base switch placement. The shortcuts to be used would be selected randomly up to the fixed number of shortcuts per processing element. The same would be done for the corner turns and the additional uplinks.

In another embodiment, the added switches would be based upon an allocation of a total number of extra switches per processing element. Then a random selection to assign each additional switch would be made from all possible uses of the extra switches (i.e., shortcuts, corner turns, or uplinks). In another embodiment, the assignment of switches would be based upon a percentage allocation of switches to each type, that is, a certain percentage of the total number of added switches would be allocated to shortcuts, another percentage allocated to corner turns, and still another percentage allocated to uplinks. The switches would still be randomly placed.

In still another embodiment, there would be no initial switch placement. Instead, a conceptual/populated design would be used to establish links between uplink switches and associated processing elements. Then all uplinks, corner turns and shortcuts associated with a processing element would be randomly added. As discussed above, a certain percentage of the switches may be assigned to shortcuts, corner turns and uplinks. There may also be a further constraint on the percentages for uplinks at a given level, that is, for the total number of uplinks, only a certain percentage may be used for level 1 to level 2 uplinks, another percentage for level 2 to level 3 uplinks, etc.

It is noted that Arora, Leighton and Maggs teach that a constant number of uplinks can be chosen to guarantee online/non-blocking routeability. The random placement of the switches discussed above should allow these embodiments to achieve this property with a high probability. In general, in expanding the networks with the placement of additional uplinks, the number of uplinks in those stages which originally had only a single parent will probably require more than one uplink, and in those stages that originally had two parents, more than two uplinks will be required.

From the foregoing description, it will be apparent that the present invention has a number of advantages, some of which have been described above, and others of which are inherent in the embodiments of the invention described above. Also, it will be understood that modifications can be made to the method described above without departing from the teachings of subject matter described herein. As such, the invention is not to be limited to the described embodiments except as required by the appended claims.

What is claimed is:

1. A method of providing connections between a plurality of processing elements comprising:
    providing a plurality of first dimension interconnect paths, wherein some of the first dimension interconnect paths are coupled to processing elements;
    providing a plurality of first dimension interconnect switches, the plurality of first dimension interconnect switches connecting selected first dimension interconnect paths to other selected first dimension interconnect paths;
    configuring the plurality of first dimension interconnect paths and the plurality of first dimension interconnect switches to form one or more first dimension trees, each first dimension tree having one or more levels of first dimension parent-child hierarchy, wherein at least one processing element is connected to at least one first dimension child at a lowest level of the first dimension parent-child hierarchy and at least one first dimension child has a plurality of first dimension parents;
    providing a plurality of second dimension interconnect paths, wherein some of the second dimension interconnect paths are coupled to processing elements;
    providing a plurality of second dimension interconnect switches, the plurality of second dimension interconnect switches connecting selected second dimension interconnect paths to other selected second dimension interconnect paths; and
    configuring the plurality of second dimension interconnect paths and the plurality of second dimension interconnect switches to form one or more second dimension trees, each second dimension tree having one or more levels of second dimension parent-child hierarchy, wherein at least one processing element is connected to at least one second dimension child at a lowest level of the second dimension parent-child hierarchy and at least one second dimension child has a plurality of second dimension parents.

2. The method according to claim 1, wherein the plurality of first dimension and second dimension interconnect paths are disposed in one or more metal layers of a semiconductor device.

3. The method according to claim 1, wherein at least one first dimension and/or second dimension tree is formed having an arity other than two.

4. The method according to claim 3, wherein the number of segments of a first level connected to a level immediately above the first level varies according to the level of the first dimension and/or second dimension hierarchy at which the first level is disposed.

5. The method according to claim 1 further comprising:
    disposing corner switches to connect one or more portions of the one or more first dimension trees to one or more portions of the one or more second dimension trees.

6. The method according to claim 1 further comprising;
    forming a plurality of metal layers in a semiconductor device;
    disposing the first dimension interconnect paths in one or more metal layers of the plurality of metal layers; and
    disposing the second dimension interconnect paths in a different one or more metal layers of the plurality of metal layers.

7. The method according to claim 1, wherein at least one first dimension and/or second dimension interconnect switch comprises a buffered switch.

8. The method according to claim 1, wherein at least one first dimension and/or second dimension interconnect path comprises a buffered wire run.

9. The method according to claim 1 further comprising:
disposing one or more shortcut runs;
disposing shortcut switches at each end of the one or more shortcut runs; and
coupling selected segments of at least one first dimension tree and/or second dimension tree with the shortcut switches and the one or more shortcut runs.

10. The method according to claim 9, wherein the one or more shortcut switches couple the selected segments at the same hierarchical level.

11. The method according to claim 1, wherein the levels of at least one first dimension tree and/or second dimension tree are staggered.

12. The method according to claim 1, wherein the one or more first dimension trees and/or the one or more second dimension trees which are present in a same channel are staggered relative to each other.

13. The method according to claim 1, wherein at least one processing element comprises an element selected from the group comprising: one or more look-up tables, fixed gates, processors, memories, programmable logic arrays, blocks of look-up tables, and any combination thereof.

14. The method according to claim 1, wherein each processing element connected to a first dimension child segment of a first dimension tree has a constant number of first dimension interconnect switches connecting the first dimension interconnect paths to the processing element or wherein each processing element connected to a second dimension child segment of a second dimension tree has a constant number of second dimension interconnect switches connecting the second dimension interconnect paths to the processing element.

15. The method according to claim 1, wherein each processing element has a constant upper bound on the number of first dimension interconnect switches and/or second dimension interconnect switches associated with the processing element and wherein the constant upper bound is invariant with the total number of processing elements being connected.

16. The method according to claim 1, wherein each processing element has a constant upper bound on the number of switches associated with the processing element and wherein the constant upper bound is invariant as additional tree levels are added to accommodate a greater number of processing elements or as tree levels are deleted to accommodate a smaller number of processing elements.

17. The method according to claim 1, wherein each processing element has a constant upper bound on the number of switches associated with the processing element and wherein the constant upper bound depends on the Rent growth rate factor and not on the total number of processing elements being interconnected.

18. The method according to claim 1, wherein the method further comprises:
providing a plurality of extra-dimensional interconnect paths, wherein some of the extra-dimensional interconnect paths are coupled to processing elements;
providing a plurality of extra-dimensional interconnect switches, the plurality of extra-dimensional interconnect switches connecting selected extra-dimensional interconnect paths to other selected extra-dimensional interconnect paths; and
configuring the plurality of extra-dimensional interconnect paths and the plurality of extra-dimensional interconnect switches to form one or more extra-dimensional trees, each extra-dimensional tree having one or more levels of extra-dimensional parent-child hierarchy, wherein at least one processing element is connected to at least one extra-dimensional child at a lowest level of the extra-dimensional parent-child hierarchy and at least one extra-dimensional child has a plurality of extra-dimensional parents.

19. The method according to claim 1, wherein the method is used to provide routing in a programmable semiconductor device.

20. The method according to claim 1, wherein the plurality of processing elements are disposed in a two-dimensional grid and the one or more first dimension trees comprise horizontal trees and the one or more second dimension trees comprise vertical trees.

21. The method according to claim 1, wherein the method further comprises allocating additional switches for connections beyond a minimum number of switches required for connectivity of the one or more first dimension trees and/or the one or more second dimension trees.

22. The method according to claim 21, wherein allocating additional switches comprises:
identifying all possible shortcuts, corner turns, and/or uplinks that may be associated with a processing element;
allocating a fixed number of shortcuts for each processing element;
allocating a fixed number of corner turns for each processing element;
allocating a fixed number of uplinks for each processing element;
randomly assigning added shortcut switches up to the fixed number of shortcuts for each processing element;
randomly assigning added corner turn switches up to the fixed number of corner turns for each processing element; and
randomly assigning added uplink switches up to the fixed number of uplinks for each processing element.

23. The method according to claim 21, wherein allocating additional switches comprises:
identifying all possible shortcuts, corner turns, and/or uplinks that may be associated with a processing element;
allocating a total number of switches for each processing element;
randomly assigning added shortcut switches for each processing element;
randomly assigning added corner turn switches for each processing element; and
randomly assigning added uplink switches for each processing element,
wherein the number of randomly assigned switches for each processing element does not exceed the total number of switches allocated for each processing element.

24. The method according to claim 23, wherein fixed percentages are selected for the total numbers of added shortcut switches, corner turn switches, and uplink switches.

25. A method for providing placement and routing of a network having multiple nodes laid out in a two-dimensional pattern, said method comprising:

partitioning the circuit into multiple partitions having a hierarchy;
using the partition hierarchy to associate nodes with processing elements;
forming one or more vertical trees based on the partition hierarchy, wherein each vertical tree has multiple levels and each vertical child at a first vertical level is connected to a vertical parent at second vertical level above the first vertical level, and at least one node is connected to a vertical child at the lowest vertical level, and wherein connections between vertical children and vertical parents are provided by vertical switches;
forming one or more horizontal trees based on the partition hierarchy, wherein each horizontal tree has multiple levels and each horizontal child at a first horizontal level is connected to a horizontal parent at second horizontal level above the first horizontal level, and at least one node is connected to a horizontal child at the lowest horizontal level, and wherein connections between horizontal children and horizontal parents are provided by horizontal switches;
constructing at least one vertical tree and/or one horizontal tree to provide a minimum number of switches between a first node and a second node; and
providing one or more corner switches to switch between at least one vertical tree and at least one horizontal tree.

26. The method according to claim 25, further comprising:
placing wire segments;
performing a route of network connections on at least one vertical tree and/or at least one horizontal tree; and
using switch selections in routing the at least one vertical tree and/or the at least one horizontal tree to connect wire segments to realize the network.

27. The method according to claim 25, wherein the one or more corner switches are applied at different levels of the hierarchy of the at least vertical tree and the at least one horizontal tree.

28. The method according to claim 27, wherein at least one level of the hierarchy of at least one vertical tree and/or at least one horizontal tree has more children than other levels of the hierarchy of the least one vertical tree and/or at least one horizontal tree.

29. A method a placing a graph with multiple nodes in two dimensions to provide routing connections between processing elements in a circuit, wherein the circuit is realized in a structure having multiple metal layers, the method comprising:
partitioning the circuit into multiple partitions to provide a partition hierarchy;
associating the nodes with processing elements based on the partition hierarchy;
assigning partitions to successive halves of a Butterfly Fat Tree network, wherein the Butterfly Fat Tree network has a plurality of horizontal channels and/or a plurality of vertical channels;
routing connections between nodes in the Butterfly Fat Tree topology;
adding one or more links between one or more nodes in at least one horizontal channel to one or more nodes in one or more other horizontal channels, wherein the one or more nodes are at a same logical level in the horizontal channels and/or adding one or more links between one or more nodes in at least one vertical channel to one or more nodes in one or more other vertical channels, wherein the one or more nodes are at a same logical level in the vertical channels; and
using an assignment of node to Butterfly Fat Tree links and a physical layout of the Butterfly Fat Tree links to define physical routes between nodes.

30. A method for providing interconnection between a plurality of processing elements comprising:
providing a plurality of switches;
arranging the plurality of switches to provide one or more tree structures, each tree structure having a plurality of branches and a plurality of levels;
associating each processing element in the plurality of processing elements with a corresponding lowest level switch at a lowest level of each tree by coupling the processing element to the corresponding lowest level switch;
recursively building each tree structure by:
coupling each switch to one or more switches at a same level in the tree structure and/or to one or more switches at a higher level in the tree structure; and
continue coupling the switches until there is a path for each processing element from one or more common points at a top level of the tree structure to each processing element,
wherein the number of switches in the path between at least one common point and the processing element is the same for each processing element and wherein at least one tree structure has an arity other than two and/or has a Rent exponent other than 0.5.

31. The method according to claim 30, wherein the one or more tree structures comprise one or more first dimension tree structures and one or more second dimension tree structures and one or more switches in the plurality of switches connect an upper level of at least one first dimension tree structure to an upper level of at least one second dimension tree structure.

32. A method for constructing a hierarchical synchronous reconfigurable array or Butterfly Fat Tree comprising:
providing a plurality of horizontal channels and/or vertical channels, wherein the plurality of horizontal channels and/or vertical channels are configured according to horizontal channels and/or vertical channels of a mesh of trees topology;
adding one or more links between one or more switching nodes in at least one horizontal channel to one or more switching nodes in one or more other horizontal channels, wherein the one or more switching nodes are at a same logical level in the horizontal channels; and/or
adding one or more links between one or more switching nodes in at least one vertical channel to one or more switching nodes in one or more other vertical channels, wherein the one or more switching nodes are at a same logical level in the vertical channels.

33. The method according to claim 32, wherein if the horizontal channels are configured in mesh of trees topology, the vertical channels are arranged in a non-augmented mesh of trees topology and if the vertical channels are configured in mesh of trees topology, the horizontal channels are arranged in a non-augmented mesh of trees topology.

34. The method according to claim 32, wherein either the horizontal channels or the vertical channels are configured in a non-augmented mesh of trees topology.

35. The method according to claim 32, further comprising:
adding one or more links between one or more switching nodes in at least one horizontal channel to one or more switching nodes in one or more vertical channels, wherein the one or more switching nodes are at a same logical level in the horizontal and vertical channels.

36. The method according to claim 32, wherein adding one or more links between one or more switching nodes in at least one horizontal channel to one or more switching nodes in one or more other horizontal channels comprises using links in one or more vertical channels and/or adding one or more links between one or more switching nodes in at least one vertical channel to one or more switching nodes in one or more other vertical channels comprises using links in one or more horizontal channels.

37. The method according to claim 32 further comprising:
adding orthogonal interchanges comprising homogeneous upper level corner turns between one or more horizontal channels and one or more vertical channels.

38. The method according to claim 32, wherein the hierarchical reconfigurable synchronous array or butterfly fat tree is implemented in a structure having multiple metal layers.

39. The method according to claim 32 further comprising adding orthogonal interchanges between at least one horizontal channel and at least one vertical channel.

40. A method of designing a network comprising:
parameterizing a mesh of trees topology by selecting or determining one or more of the following parameters: base channels, Rent exponents, growth rate per level, arity, flattening, shortcuts, upper level corner turns, and staggering; and
optimizing the parameters for desired network performance characteristics wherein the network is constructed according to the method of claim 32.

41. A method for mapping a graph of connected nodes:
recursively bisecting the graph;
assigning graph partitions from the bisection to successive halves of a Butterfly Fat Tree;
building the Butterfly Fat Tree with a plurality of hierarchical horizontal and vertical channels, wherein at least one horizontal channel and/or vertical channel has at least one child segment connected to a plurality of parent segments at the same or different levels in the hierarchical horizontal and/or vertical channels; and,
routing the mapped network on the Butterfly Fat Tree.

42. The method according to claim 41, wherein building the Butterfly Fat Tree comprises adding one or more links between one or more switching nodes in at least one horizontal channel to one or more switching nodes in one or more other horizontal channels, wherein the one or more switching nodes are at a same logical level in the horizontal channels and/or adding one or more links between one or more switching nodes in at least one vertical channel to one or more switching nodes in one or more other vertical channels, wherein the one or more switching nodes are at a same logical level in the vertical channels.

43. The method according to claim 41, wherein the method further comprises allocating additional switches for connections.

44. The method according to claim 43, wherein allocating additional switches comprises:
identifying all possible shortcuts, corner turns, and/or uplinks that may be associated with a node;
allocating a fixed number of shortcuts for each node;
allocating a fixed number of corner turns for each node;
allocating a fixed number of uplinks for each node;
randomly assigning added shortcut switches up to the fixed number of shortcuts for each node;
randomly assigning added corner turn switches up to the fixed number of corner turns for each node; and
randomly assigning added uplink switches up to the fixed number of uplinks for each node.

45. The method according to claim 43, wherein allocating additional switches comprises:
identifying all possible shortcuts, corner turns, and/or uplinks that may be associated with a node;
allocating a total number of switches for each node;
randomly assigning added shortcut switches for each node;
randomly assigning added corner turn switches for each node; and
randomly assigning added uplink switches for each node, wherein the number of randomly assigned switches for each node does not exceed the total number of switches allocated for each node.

46. The method according to claim 45, wherein fixed percentages are selected for the total numbers of added shortcut switches, corner turn switches, and uplink switches.

47. A method for laying out a plurality of processing elements in a structure having multiple metal layers at different levels comprising:
connecting the plurality of processing elements to plurality of hierarchical horizontal and vertical trees, wherein at least one horizontal channel and/or vertical channel has at least one child segment connected to a plurality of parent segments at the same or different levels in the hierarchical horizontal and/or vertical channels;
associating switches providing inter-tree-level routing in each horizontal and vertical tree with a corresponding processing element; and
assigning wiring for different tree levels to metal layers at different or same levels.

48. The method according to claim 47, wherein the switches are disposed on a selected layer and the method further comprises providing one or more via channels to connect wire runs on different or same levels to the switches.

49. The method according to claim 48, wherein the switches and processing elements are located on a substrate.

50. The method according to claim 48, wherein the one or more via layers are disposed between metal layers.

51. The method according to claim 48, wherein customization of network connectivity is provided by one or more customizable via layers.

52. The method according to claim 47, wherein associating switches comprises:
associating switches at lowest levels of the one or more horizontal and/or vertical trees with the corresponding processing element;
associating switches at progressively higher levels of the one or more horizontal and/or vertical trees with corresponding processing elements until there are only half as many switches at a level as at the lowest level of the one or more horizontal and/or vertical trees;
associate the switches at this level with one half of the processing elements;
repeat the association of switches at progressively higher levels with corresponding processing elements within the one half of the processing elements until there is an association of switches to half as many processing elements as at a previous level so that there are half as many switches as this level as there are processing elements that have not had upper level switches assigned;
select one half of the remaining switches and assign to the corresponding processing elements; and
continue associating switches in this manner until switches at all levels are assigned.

53. The method according to claim 47, wherein associating switches comprises:
- identifying the lowest, successive tree level where the number of switches out of the parent stage is half the number of switches in a present level;
- grouping subtree switching between these two stages into a macro switch;
- associating each macro switch with a processing element, within a span of processing elements which are children of the macro switch, which does not already have a macro switch associated with it; and
- setting the present level as the last set of macro switches placed; and
- repeating the identifying, grouping and associating processes for successive levels until all switches have been placed.

54. The method according to claim 47, wherein associating switches comprises:
- associating switches at a lowest level of one or more horizontal and/or vertical trees with corresponding processing elements;
- moving up a level in the one or more horizontal and/or vertical trees;
- distributing the switches at this next level to the processing element within a span of the switches with the least number of assigned switches; and
- repeating the associating, moving, and distributing processes until all switches have been placed.

55. The method according to claim 52, wherein switches to higher levels of the horizontal and/or vertical trees are uplink switches and the method further comprises adding shortcut connections by associating a shortcut switch with the same processing element as the associated uplink switch.

56. The method according to claim 54, wherein switches to higher levels of the horizontal and/or vertical trees are uplink switch and the method further comprises adding shortcut connections by associating a shortcut switch with the same processing element as the associated uplink switch.

57. The method according to claim 55, wherein one or more shortcut switches are placed on one side of the shortcut connections and another side of the shortcut connections are direct connections with the associated shortcut switches.

58. The method according to claim 56, wherein one or more shortcut switches are placed on one side of the shortcut connections and another side of the shortcut connections are direct connections with the associated shortcut switches.

59. The method according to claim 53, wherein at least one macro switch is extended with one or more links for shortcut connections.

60. The method according to claim 52, wherein the plurality of horizontal trees comprises a plurality of horizontal channels configured according to horizontal channels of a mesh of trees topology and the plurality of vertical trees comprise a plurality of vertical channels configured according to vertical channels of a mesh of trees topology and the method further comprises:
- adding one or more links between one or more switching nodes in at least one horizontal channel to one or more switching nodes in one or more other horizontal channels, wherein the one or more switching nodes are at a same logical level in the horizontal channels and/or adding one or more links between one or more switching nodes in at least one vertical channel to one or more switching nodes in one or more other vertical channels, wherein the one or more switching nodes are at a same logical level in the vertical channels.

61. The method according to claim 60, wherein links are routed along orthogonal interconnect channels.

62. The method according to claim 61, wherein one or more added links comprise one or more added wires.

63. The method according to claim 61, wherein one or more added links comprise one or more wires already present in channels being used.

64. The method according to claim 54, wherein the plurality of horizontal trees comprises a plurality of horizontal channels configured according to horizontal channels of a mesh of trees topology and the plurality of vertical trees comprise a plurality of vertical channels configured according to vertical channels of a mesh of trees topology and the method further comprises:
- adding one or more links between one or more switching nodes in at least one horizontal channel to one or more switching nodes in one or more other horizontal channels, wherein the one or more switching nodes are at a same logical level in the horizontal channels and/or adding one or more links between one or more switching nodes in at least one vertical channel to one or more switching nodes in one or more other vertical channels, wherein the one or more switching nodes are at a same logical level in the vertical channels.

65. The method according to claim 47, wherein associating switches comprises:
- associating switches at lowest levels of the one or more horizontal and/or vertical trees with corresponding processing elements; and
- associating switches at progressively higher levels of the one or more horizontal and/or vertical trees in blocks covered by arity-1 children over tails of said children.

66. The method according to claim 65, wherein associating switches at progressively higher levels comprises using one slot from a last block of each child and/or using a last block from each subsequent descendent recursively.

67. The method according to claim 65, wherein associating switches at progressively higher levels comprises finding a least populated block, associating a switch, and repeating until all switches are assigned.

* * * * *